US012727460B2

(12) United States Patent
Chu et al.

(10) Patent No.: US 12,727,460 B2
(45) Date of Patent: Sep. 1, 2026

(54) INTEGRATED CIRCUIT STRUCTURE WITH RECESSED TRENCH CONTACT AND DEEP BOUNDARY VIA

(71) Applicant: Intel Corporation, Santa Clara, CA (US)

(72) Inventors: Tao Chu, Portland, OR (US); Guowei Xu, Portland, OR (US); Feng Zhang, Hillsboro, OR (US); Chiao-Ti Huang, Portland, OR (US); Minwoo Jang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 18/072,569

(22) Filed: Nov. 30, 2022

(65) Prior Publication Data

US 2024/0178101 A1 May 30, 2024

(51) Int. Cl.

| | |
|---|---|
| ***H10W 20/20*** | (2026.01) |
| ***H10D 30/67*** | (2025.01) |
| ***H10D 62/10*** | (2025.01) |
| ***H10D 84/83*** | (2025.01) |

(52) U.S. Cl.

CPC ........ *H10W 20/20* (2026.01); *H10D 30/6729* (2025.01); *H10D 30/6757* (2025.01); *H10D 62/121* (2025.01); *H10D 84/834* (2025.01)

(58) Field of Classification Search

CPC .............. H10W 20/20; H10D 30/6729; H10D 30/6757

See application file for complete search history.

(56) References Cited

U.S. PATENT DOCUMENTS

2023/0215767 A1* 7/2023 Xie ........................ H10D 30/43 257/329
2023/0345691 A1* 10/2023 Xie .................... H10D 30/6757

* cited by examiner

*Primary Examiner* — Errol V Fernandes
(74) *Attorney, Agent, or Firm* — Schwabe, Williamson & Wyatt, P.C.

(57) ABSTRACT

Integrated circuit structures having recessed trench contacts and deep boundary vias are described. For example, an integrated circuit structure includes a plurality of gate lines extending over a plurality of semiconductor nanowire stack channel structures. A plurality of trench contacts extends over a plurality of source or drain structures, where a first one of the plurality of trench contacts has a recess therein. A backside metal routing layer is extending beneath the plurality of gate lines and beneath the plurality of trench contacts. A conductive structure couples the backside metal routing layer to a second one of the one or more of the plurality of trench contacts. The conductive structure includes a pillar portion in contact with the second one of the plurality of trench contacts, the pillar portion on a line portion, the line portion in contact with and extending along the backside metal routing layer.

20 Claims, 24 Drawing Sheets

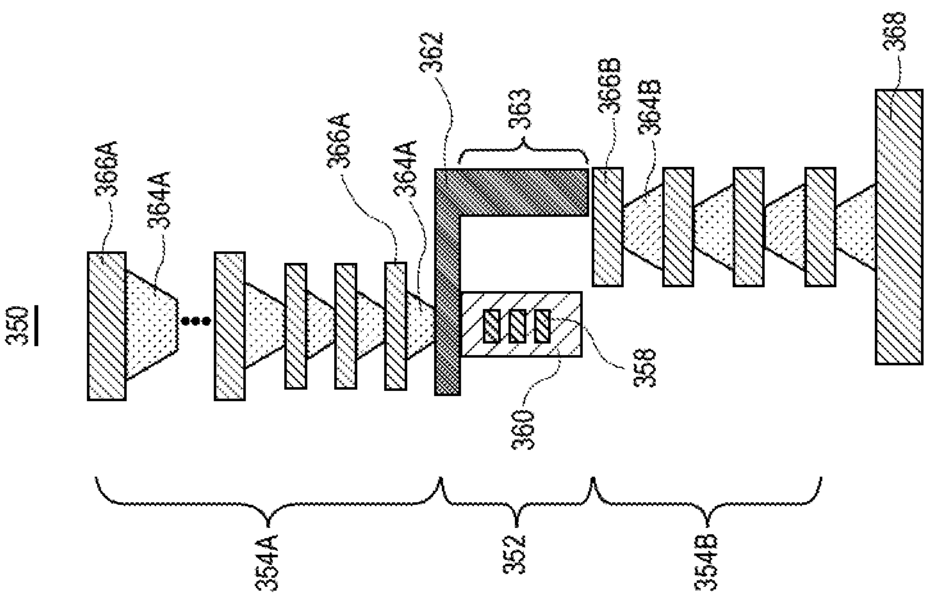
FIG. 3
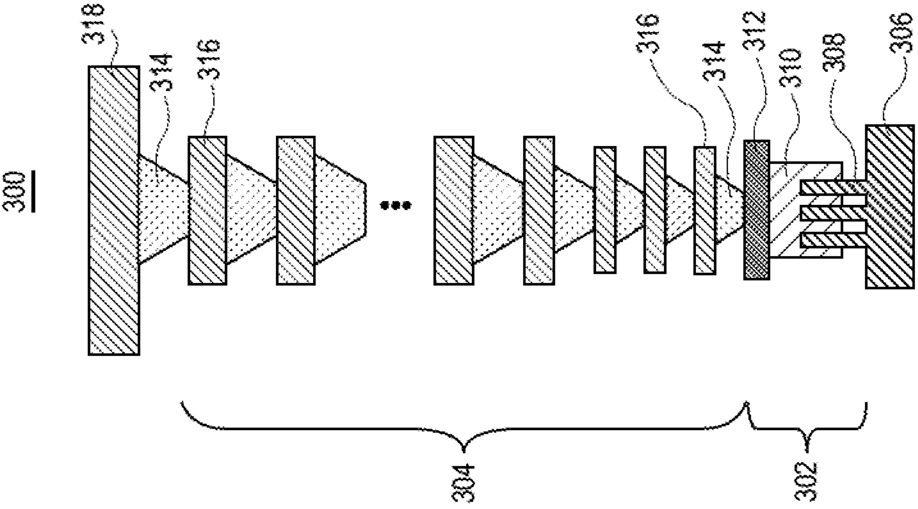

900
920
916A
932
916B
906
932
908
930
916A
904
912
904
902
906
910

1100A
1102
1108C
1106
1104
1112B
1110B
1108B
1116
1110A
1112A
1108A 1000A
1016
1008C
1012B
1002
1006
1010B
1004
1014
1008B
1010A
1008A
1012A 1224
1224
1252'
1250'

1204'
1216
1250'
1210
1214
1208
1206'
1222
1252'

1220
1220
1252'
1250'

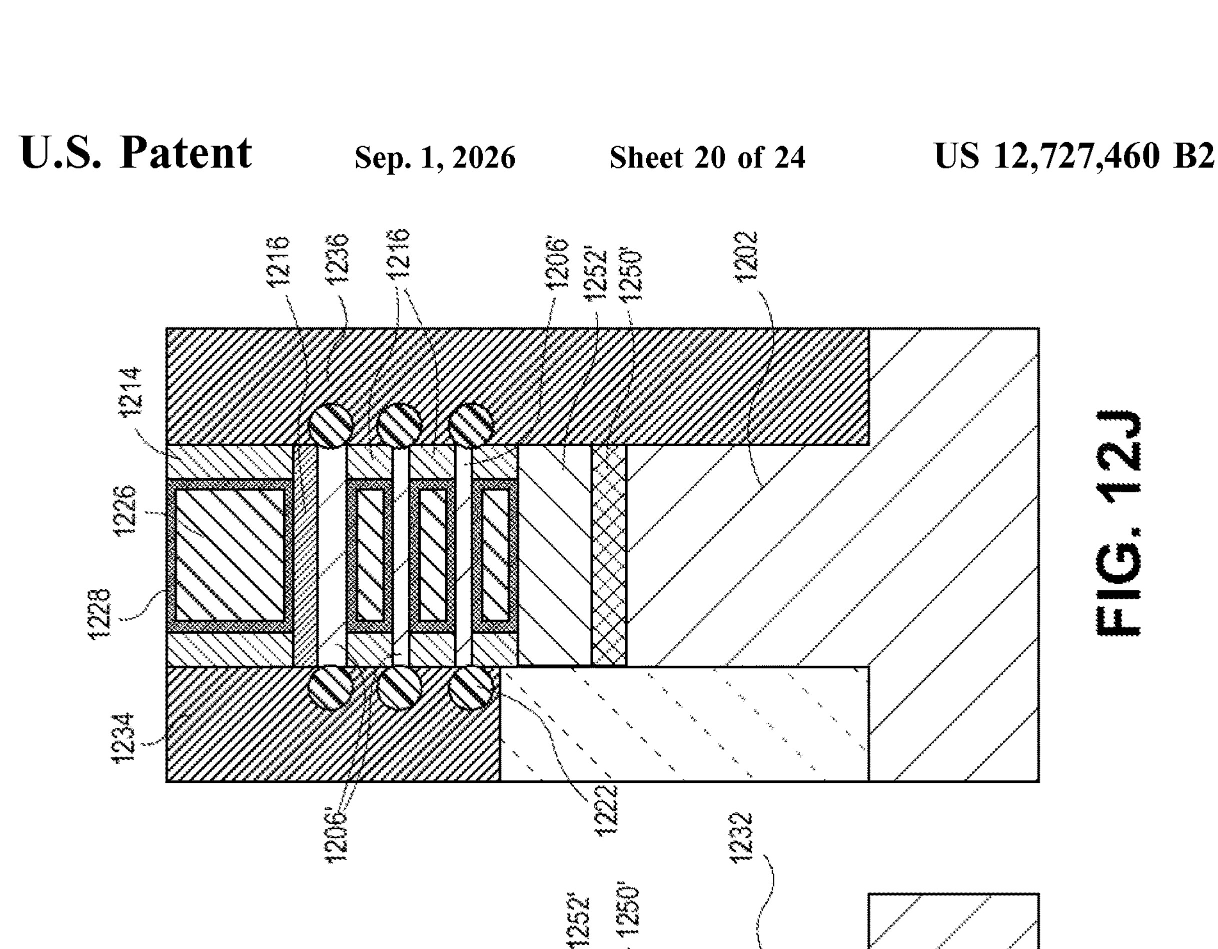
FIG. 12J
FIG. 12I
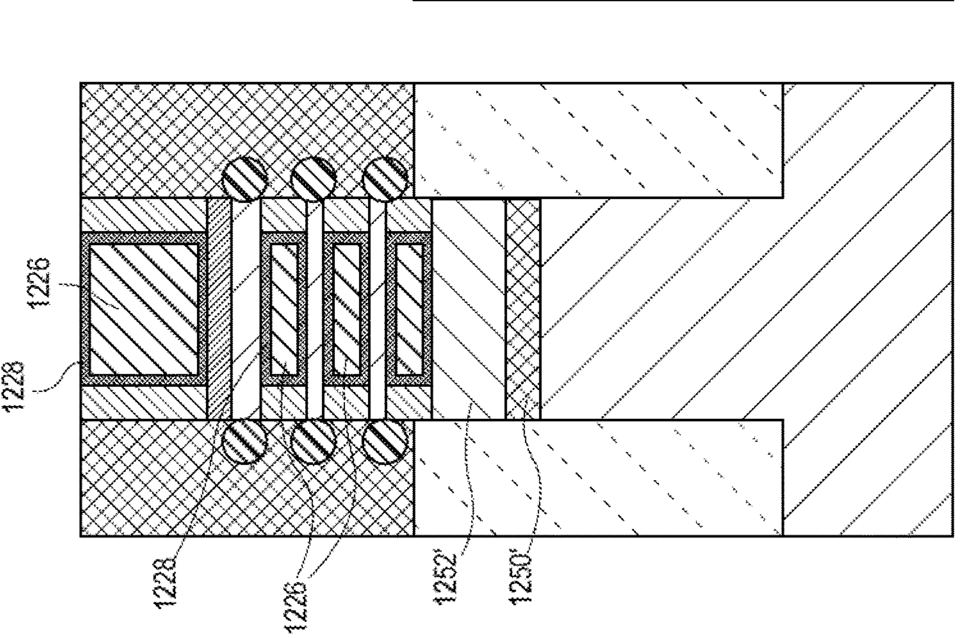
FIG. 12H

INTEGRATED CIRCUIT STRUCTURE WITH RECESSED TRENCH CONTACT AND DEEP BOUNDARY VIA

TECHNICAL FIELD

Embodiments of the disclosure are in the field of advanced integrated circuit structure fabrication and, in particular, integrated circuit structures having recessed trench contact and deep boundary via.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIG. 3 illustrates cross-sectional views of an interconnect stack having front side power delivery and of an interconnect stack having backside power delivery, in accordance with an embodiment of the present disclosure.

FIGS. 12A-12J illustrates cross-sectional views of various operations in a method of fabricating a gate-all-around integrated circuit structure, in accordance with an embodiment of the present disclosure.

DESCRIPTION OF THE EMBODIMENTS

Figure 1A:
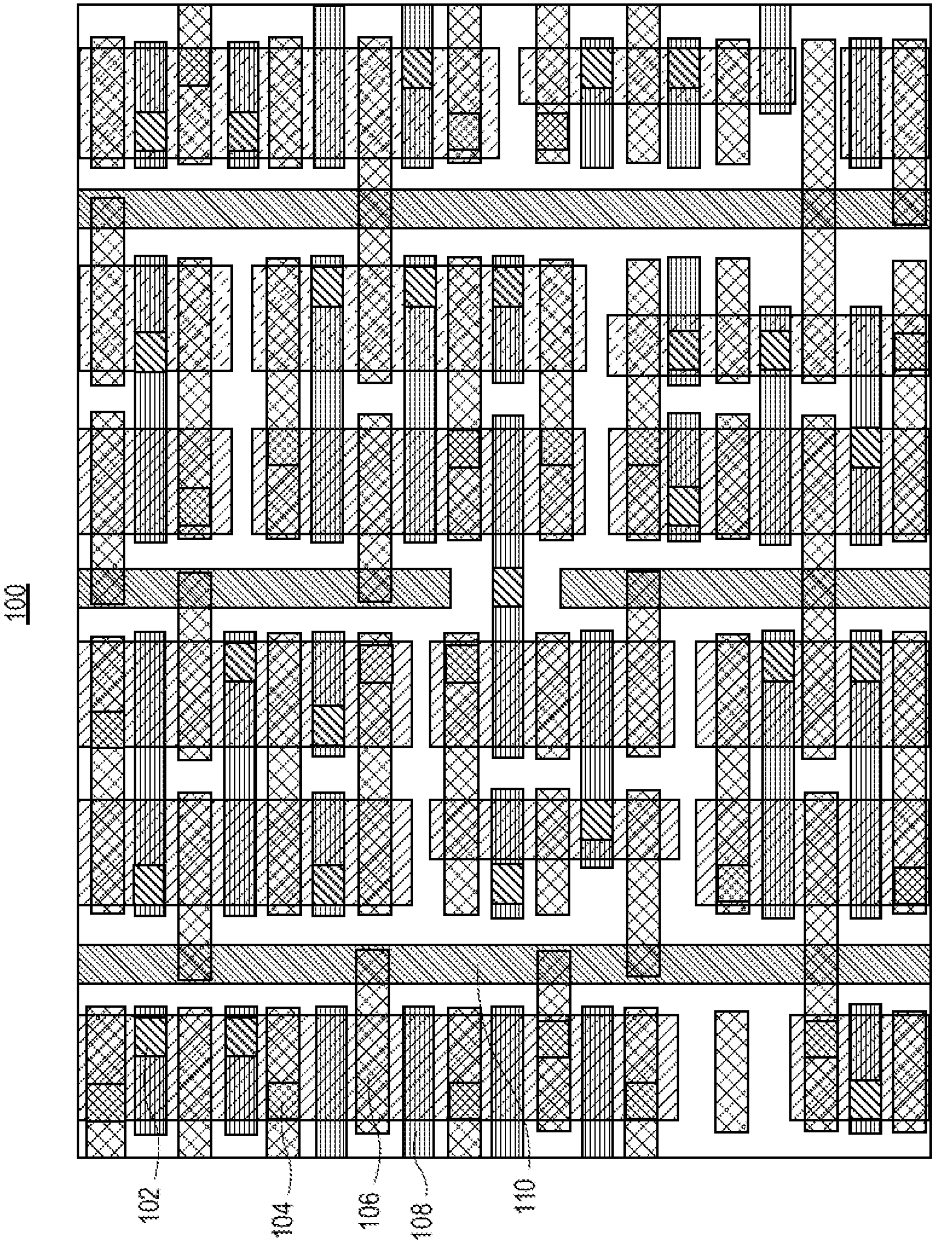
FIG. 1A illustrates a layout of an integrated circuit structure including non-recessed trench contacts and deep boundary vias.

Integrated circuit structures having recessed trench contact and deep boundary via are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments are directed to trench contact and deep boundary via partial recess for parasitic capacitance reduction. In some embodiments, trench contacts and deep boundary vias are recessed to remove a volume of metal that may otherwise effectively form a capacitor with proximate gate metal structures.

To provide context, FIG. 1A illustrates a layout of an integrated circuit structure including non-recessed trench contacts and deep boundary vias.

Referring to FIG. 1A, an integrated circuit structure 100 includes gate vias 102, trench contact vias 104, trench contacts 106, gate lines 108, and deep boundary vias 110. Given the high density of the layout, detrimental parasitic capacitance can be high between gate lines 108 and trench contacts 106, and/or between gate lines 108 and deep boundary vias 110. In an embodiment, as described below, the trench contacts 106 and/or the deep boundary vias 110 are recessed in various locations in order to reduce such parasitic capacitance. Such recessing maintains electrical continuity while removing a bulk amount of metal from the conductive structures.

Figure 1B:
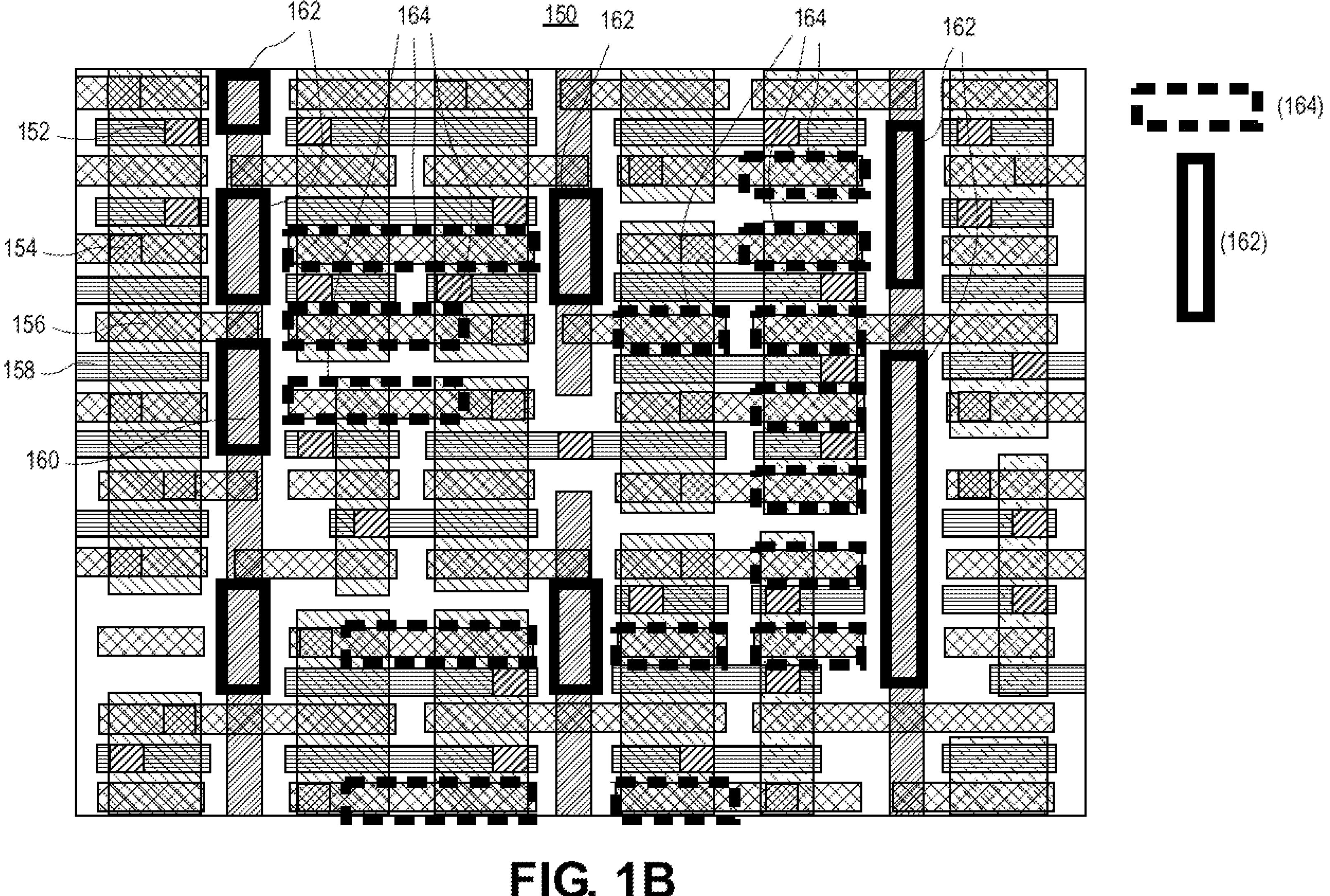
FIG. 1B illustrates a layout of an integrated circuit structure including recessed trench contacts and deep boundary vias, in accordance with an embodiment of the present disclosure.

As an exemplary structure, FIG. 1B illustrates a layout of an integrated circuit structure including recessed trench contacts and deep boundary vias, in accordance with an embodiment of the present disclosure.

Referring to FIG. 1B, an integrated circuit structure 150 includes gate vias 152, trench contact vias 154, trench contacts 156, gate lines 158, and deep boundary vias 160. In an embodiment, one or more of the trench contacts are recessed at locations 164. The recessing provides one or more recessed trench contacts. In an embodiment, one or more of the deep boundary vias are recessed at locations 162. The recessing provides one or more recessed deep boundary vias. In an embodiment, the recessing reduces the impact of detrimental parasitic capacitance for the structure.

As used throughout, a recessed trench contact can be referred to as having a trench contact that has a recess therein. As used throughout, as is described in greater detail below, a recessed deep boundary via can be referred to as a conductive structure including a pillar portion on a line portion. In one embodiment, the line portion is in contact with and is extending along the backside metal routing layer.

Figure 2A:
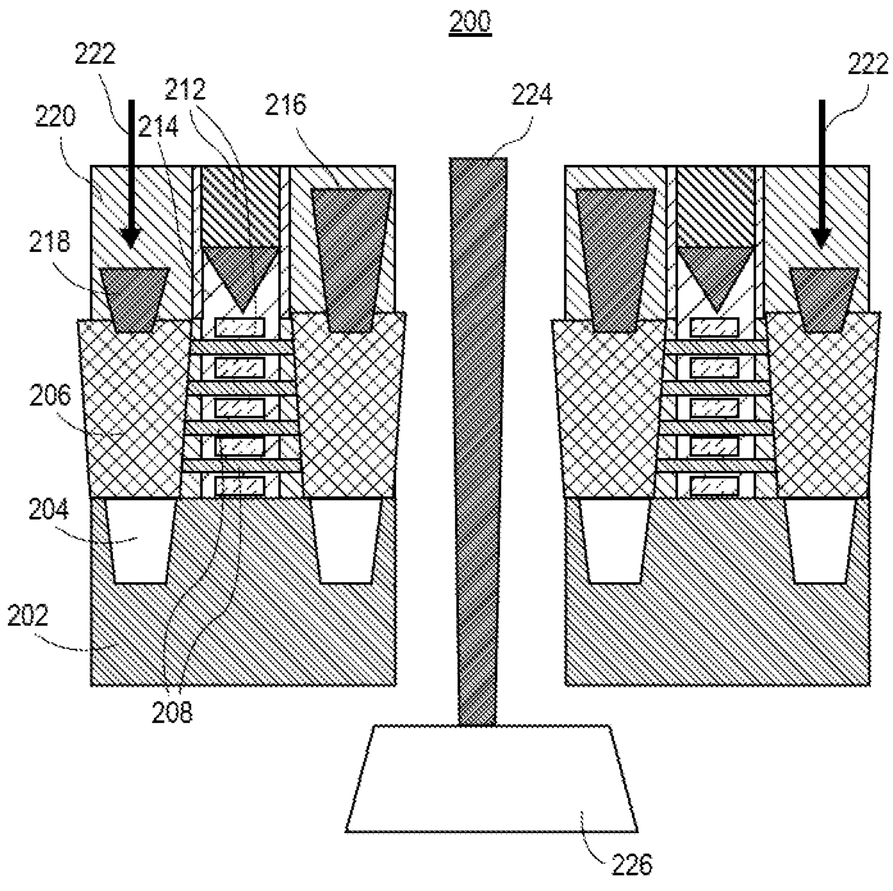
FIG. 2A illustrates a cross-sectional view of an integrated circuit structure including recessed trench contact structures, in accordance with an embodiment of the present disclosure.
Figure 2B:
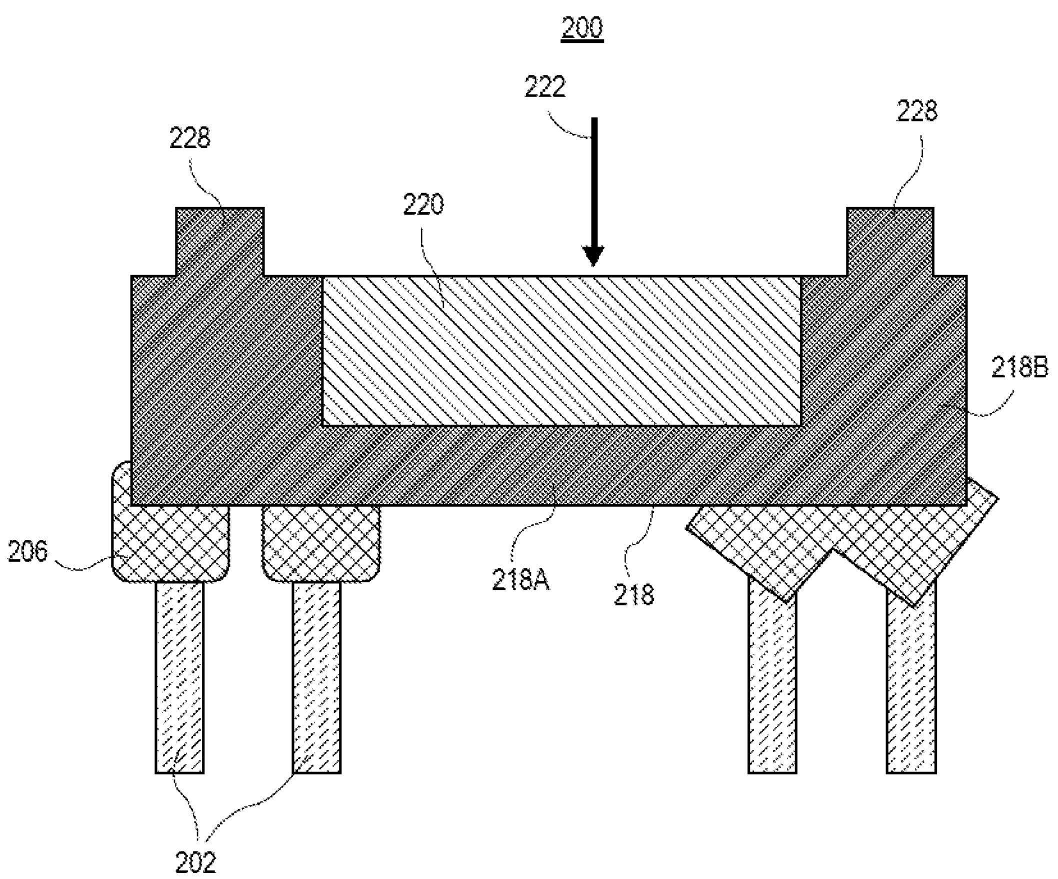
FIG. 2B illustrates a cross-sectional view of the integrated circuit structure of FIG. 2A, as taken through a recessed trench contact structure along a direction orthogonal to that of FIG. 2A, in accordance with an embodiment of the present disclosure.

As an exemplary structure, FIG. 2A illustrates a cross-sectional view of an integrated circuit structure including recessed trench contact structures, in accordance with an embodiment of the present disclosure. FIG. 2B illustrates a cross-sectional view of the integrated circuit structure of FIG. 2A, as taken through a recessed trench contact structure along a direction orthogonal to that of FIG. 2A, in accordance with an embodiment of the present disclosure. It is to be appreciated that a fin structure can be used in place of the described stacks of nanowires or nanoribbons.

Referring to FIG. 2A, an integrated circuit structure 200 includes a substrate portions 202 (such as sub-fin structures) having isolation structures 204 therein. Epitaxial source or drain structures 206 are at ends of corresponding stacks of nanowires or nanoribbons 208. Gate structures 212 and corresponding gate spacers 214 are over the corresponding stacks of nanowires or nanoribbons 208. Non-recessed trench contacts 216 (or non-recessed trench contact portions) are on corresponding ones of the epitaxial source or drain structures 206. Recessed trench contacts 218 are on corresponding other ones of the epitaxial source or drain structures 206, as recessed in direction 222. A dielectric layer 220 is over the trench contacts. The integrated circuit structure 200 also includes a deep boundary via 224 which may be coupled to a backside metal layer 226, as is depicted.

Referring to FIG. 2B, the integrated circuit structure 200 is shown as taken through a recessed trench contact structure 218. Recessed trench contact structure 218 includes a recessed portion 218A and non-recessed portions 218B. Trench contact vias 228 can be coupled to the non-recessed portions 218B, as is depicted. The dielectric layer 220 fills the volume above the recessed portion 218A, e.g., fills the volume previously occupied by metal.

Figure 2C:
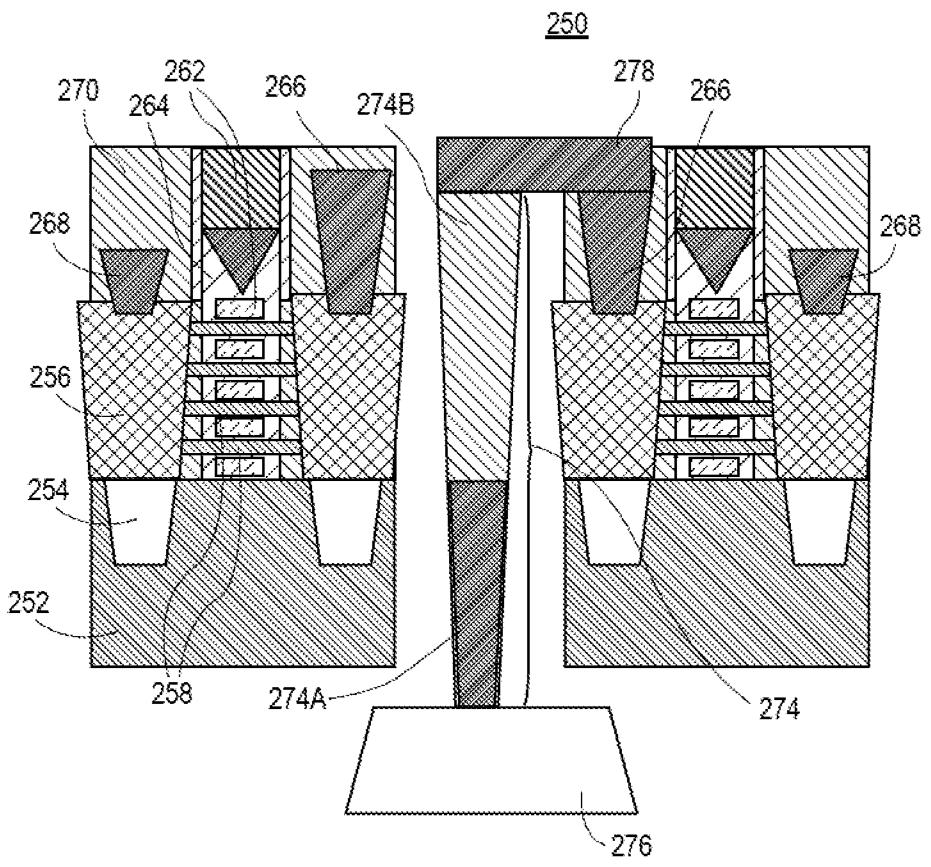
FIG. 2C illustrates a cross-sectional view of an integrated circuit structure including recessed trench contact structures and a recessed deep boundary via structure, in accordance with an embodiment of the present disclosure.
Figure 2D:
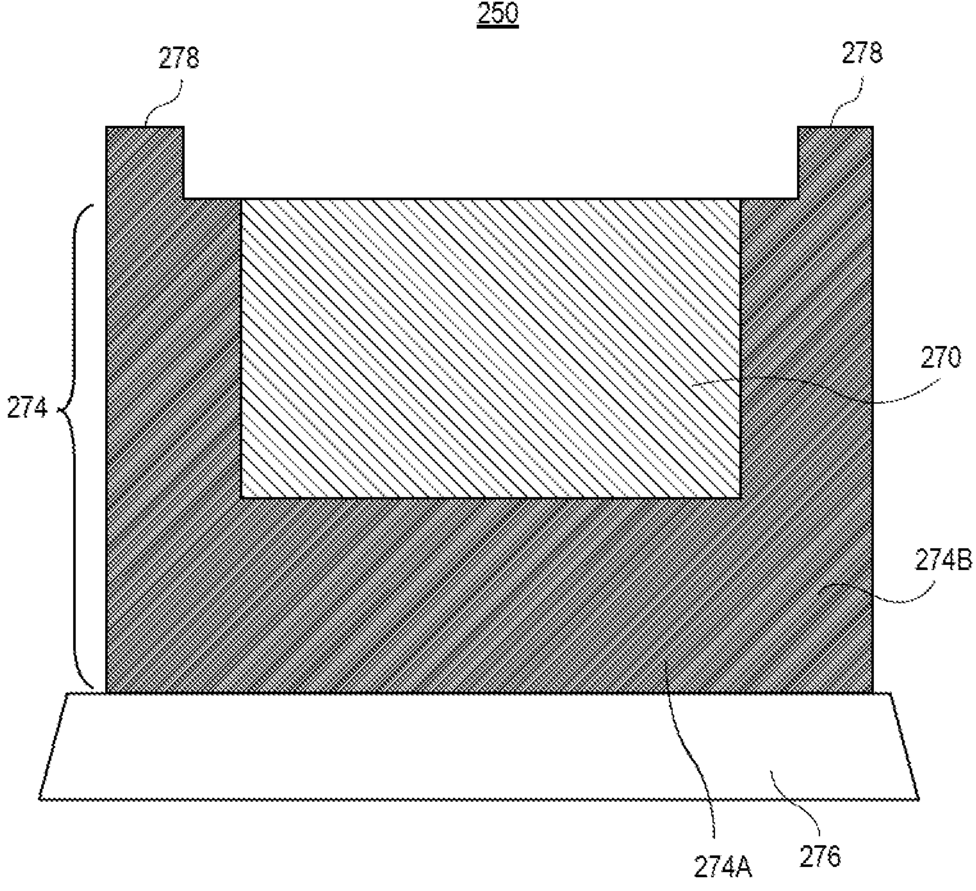
FIG. 2D illustrates a cross-sectional view of the integrated circuit structure of FIG. 2C, as taken through a deep boundary via structure along a direction orthogonal to that of FIG. 2C, in accordance with an embodiment of the present disclosure.

As another exemplary structure, FIG. 2C illustrates a cross-sectional view of an integrated circuit structure including recessed trench contact structures and a recessed deep boundary via structure, in accordance with an embodiment of the present disclosure. FIG. 2D illustrates a cross-sectional view of the integrated circuit structure of FIG. 2C, as taken through a recessed deep boundary via structure along a direction orthogonal to that of FIG. 2C, in accordance with an embodiment of the present disclosure.

Referring to FIG. 2C, an integrated circuit structure 250 includes a substrate portions 252 (such as sub-fin structures) having isolation structures 254 therein. Epitaxial source or drain structures 256 are at ends of corresponding stacks of nanowires or nanoribbons 258. Gate structures 262 and corresponding gate spacers 264 are over the corresponding stacks of nanowires or nanoribbons 258. Non-recessed trench contacts 266 (or non-recessed trench contact portions) are on corresponding ones of the epitaxial source or drain structures 256. Recessed trench contacts 268 are on corresponding other ones of the epitaxial source or drain structures 256. A dielectric layer 270 is over the trench contacts. The integrated circuit structure 250 also includes a recessed deep boundary via structure 274 which may be coupled to a backside metal layer 276, as is depicted. The recessed deep boundary via structure 274 includes a lower conductive pillar portion 274A and an upper dielectric portion 274B. A local interconnect 278 is above the deep boundary via structure 274 and can couple a non-recessed trench contact (or non-recessed trench contact portion) and a non-recessed portion of the recessed deep boundary via structure 274 (such as the non-recessed portion of the recessed deep boundary via structure 274 shown in FIG. 2D).

Referring to FIG. 2D, the integrated circuit structure 250 is shown as taken through recessed deep boundary via structure 274. Recessed deep boundary via structure 274 includes a recessed portion 274A and non-recessed portions 274B. Local interconnects 278 can be coupled to the non-recessed portions 274B, as is depicted. The dielectric layer 270 fills the volume above the recessed portion 274A, e.g., fills the volume previously occupied by metal.

As described above, embodiments may include both a recessed trench contact structure and a recessed deep boundary via structure. However, it is to be appreciated that embodiments described herein may include only a recessed trench contact structure or a recessed deep boundary via structure, and need not necessarily include both a recessed trench contact structure and a recessed deep boundary via structure. For example, in another aspect, one or more embodiments are directed to recessed self-aligned deep boundary via architectures.

To provide context, in standard cell design, the diffusion placement and metal routing layers are designed around a power delivery scheme. It can be through front side bump to the MO and the diffusion contact or in the newer architectures it can be through wafer backside metals would be tapped through a via that would contact the diffusion contact on the front side. When these are performed, either on the front side metals or the diffusion there is a space allocation for the delivery of power.

Traditionally, power is delivered from a front side interconnect. At standard cell level, power can be delivered right on top of transistors or from a top and bottom cell boundary. Power delivered from a top and bottom cell boundary enables relatively shorter standard cell height with slightly higher power network resistance. However, a front side power network shares interconnect stack with signal routing and reduces signal routing tracks. In addition, for high performance design, top and bottom cell boundary power metal wires must be wide enough to reduce power network resistance and improve performance. This normally results in a cell height increase. In accordance with one or more embodiments of the present disclosure, delivering power from a wafer or substrate backside can be implemented to solve area and performance problems. At the cell level, wider metal 0 power at the top and bottom cell boundary may no longer be needed and, hence, cell height can be reduced. In addition, power network resistance can be significantly reduced resulting in performance improvement. At block and chip level, front side signal routing tracks are increased due to removed power routing and power network resistance is significantly reduced due to very wide wires, large vias and reduced interconnect layers.

In earlier technologies, a power delivery network from bump to the transistor required significant block resources. Such resource usage on the metal stack expressed itself in some process nodes as Standard Cell architectures with layout versioning or cell placement restrictions in the block level. In an embodiment, eliminating the power delivery network from the front side metal stack allows free sliding cell placement in the block without power delivery complications and placement related delay timing variation.

As a comparison, FIG. 3 illustrates cross-sectional views of an interconnect stack having front side power delivery and of an interconnect stack having backside power delivery, in accordance with an embodiment of the present disclosure.

Referring to FIG. 3, an interconnect stack 300 having front side power delivery includes a transistor 302 and signal and power delivery metallization 304. The transistor 302 includes a bulk substrate 306, semiconductor fins 308, a terminal 310, and a device contact 312. The signal and power delivery metallization 304 includes conductive vias 314, conductive lines 316, and a metal bump 318.

Referring again to FIG. 3, an interconnect stack 350 having backside power delivery includes a transistor 352, front side signal metallization 354A, and power delivery metallization 354B. The transistor 352 includes semiconductor nanowires or nanoribbons 358, a terminal 360, and a device contact 362, and a boundary deep via 363. The front side signal metallization 354A includes conductive vias 364A and conductive lines 366A. The power delivery metallization 354B includes conductive vias 364B, conductive lines 366B, and a metal bump 368.

To provide further context, one of the ultimate goals in Standard Cell design is to minimize the impact of the power delivery to the signal routing in terms of area, while maintaining a robust power delivery scheme which would have minimum voltage drop from the supply. With front side power delivery, commercialized Standard Cell architectures had to allocate routing tracks for power and ground from the top of the front side stack to the first metal routing layer, MO. This approach would exploit metal routing tracks. That means tighter metal pitches are required to deliver power while routing signals. Tighter metal pitches cause higher cap and resistance resulting in higher power consumption. Furthermore, due to the resistance greater voltage drop occurs from the top of the stack to the transistor source.

With boundary deep via (DVB) based power delivery, power delivery is enabled from the backside without allocating tracks in the front side metal routing tracks. However, this technology requires space between the nmos and pmos devices across the cell border to deliver the power to front side diffusion contact for the Standard Cells. With boundary deep via (DVB) technology, the power delivery occurs from the backside through the space between n diffusions and p diffusions. This can cause valuable real-estate on the front end being used for power delivery, instead of increasing the drive current/per area in the transistors.

Figure 4:
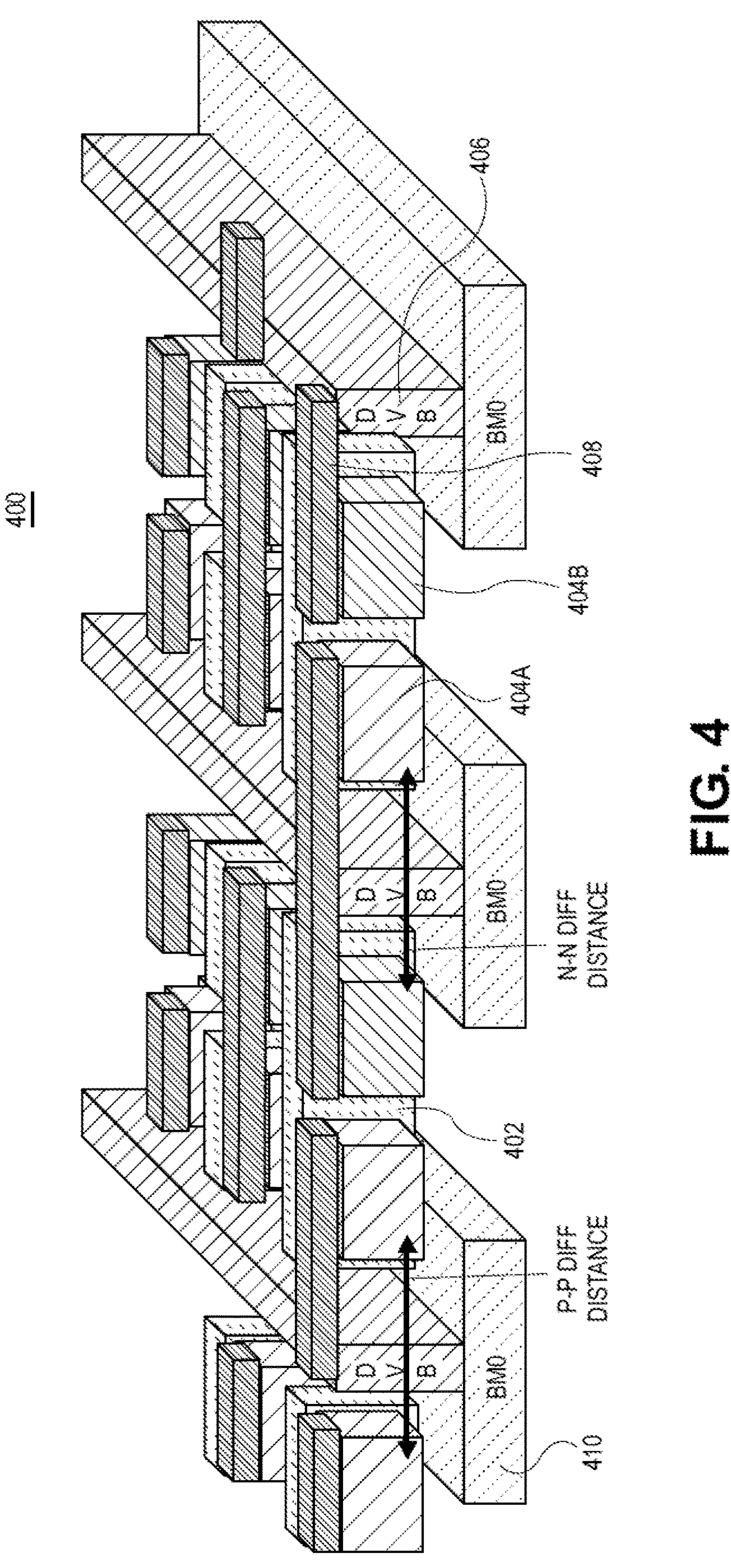
FIG. 4 illustrates an angled cross-sectional view of an integrated circuit structure having a boundary deep via (DVB) architecture, in accordance with an embodiment of the present disclosure.

As an exemplary structure, FIG. 4 illustrates an angled cross-sectional view of an integrated circuit structure having a boundary deep via (DVB) architecture, in accordance with an embodiment of the present disclosure.

Referring to FIG. 4, an integrated circuit structure 400 includes gate lines 402, N-type source or drain structures 404A, P-type source or drain structures 404B, boundary deep vias (DVBs) 406, front-side local interconnects 408, and backside metal routing layers 410 (BM0 layers). A P-P differential distance and an N-N differential distance are shown as accommodating intervening boundary deep vias (DVBs) 406.

However, in an embodiment, area loss associated with the above architecture can be reduced, e.g., using one or both of with the following (A) self-alignment, and/or (2) recess. Regarding self-alignment, a typical DVB is processed in such a way that the distance of the gate ends and DVB distance is resist defined. Therefore, with edge placement error, a DVB can end up being closer to the gate ends than nominally intended. Consequently, the distance between the DVB and gate ends needs to be set at a distance that would have to consider the distance required for avoiding insulator breakdown and edge placement error, leading to a greater than desired cell height or in other words area loss. On the other hand, in accordance with an embodiment of the present disclosure, implementation of a metal gate cut process enables a self-aligned fabrication scheme for the DVB where the DVB and gate-end distance is defined by a conformal liner rather than a resist defined edge, leading to a significantly reduced DVB gate-end distance without compromising reliability. Regarding recess, even though with a self-alignment scheme the DVB can be fabricated closer to the gate-end, below a certain distance further incrementing of the drive does not overcome the capacitance deficit caused by the coupling between gate and the DVB in terms of performance. In an embodiment, recessing the DVB in the areas aligned to the gate ends decreases the capacitance where in turn allows the reduction of the liner thickness, resulting in cell scaling by either increasing the active transistor area or decreasing the cell height.

To provide further context, current boundary deep via (DVB) process edge is resist defined versus the gate-end. It is a wall of via that rises up from the backside metal layer, BM0. Currently, the distance between the DVB and the gate ends are resist defined. Therefore, with edge placement error, DVB can end up being closer to the gate ends than nominally intended. Consequently, the distance between the DVB and gate ends needs to be set at a distance that would have to consider the distance required for avoiding insulator breakdown and edge placement error, leading to a greater than desired cell height or in other words area loss. Since DVB is a continuous wall of via, it couples with poly ends and drain diffusion of transistors, resulting in higher than desired capacitance, limiting scaling in terms of cell level performance.

In accordance with one or more embodiments of the present disclosure, significant improvement over a state-of-the-art boundary deep via (DVB) process is achieved using a process flow that enables self-alignment of a DVB edge to poly edges and recession of the bulk via that does not connect to source.

Advantages of implementing one or more embodiments described herein can include one or more of (1) a self-alignment to gate edges and recession of the DVB enable area and performance scaling of technology, (2) enabling on the order of 40% reduction in DVB to Gate-End distance which can be used for either cell height reduction and/or performance improvement, 3) self-alignment of the DVB can be detected through a distinct material change around the Boundary Deep Via at a regular thickness.

Figure 5:
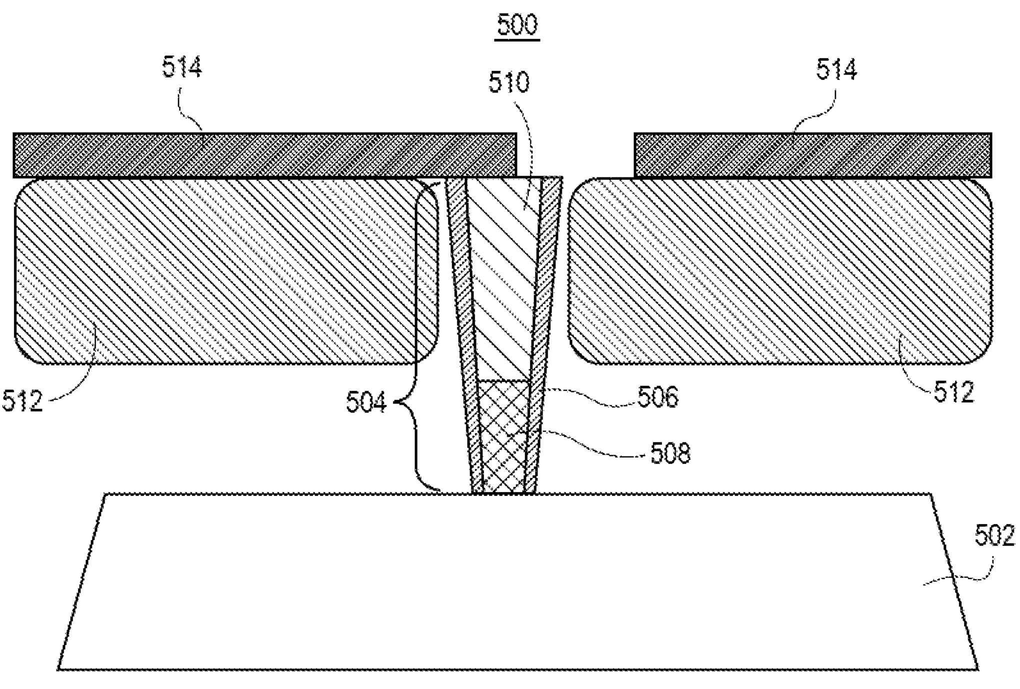
FIG. 5 illustrates a cross-sectional view of a portion of a recessed boundary deep via (DVB) in a location between source or drain structures, in accordance with an embodiment of the present disclosure.
Figure 6:
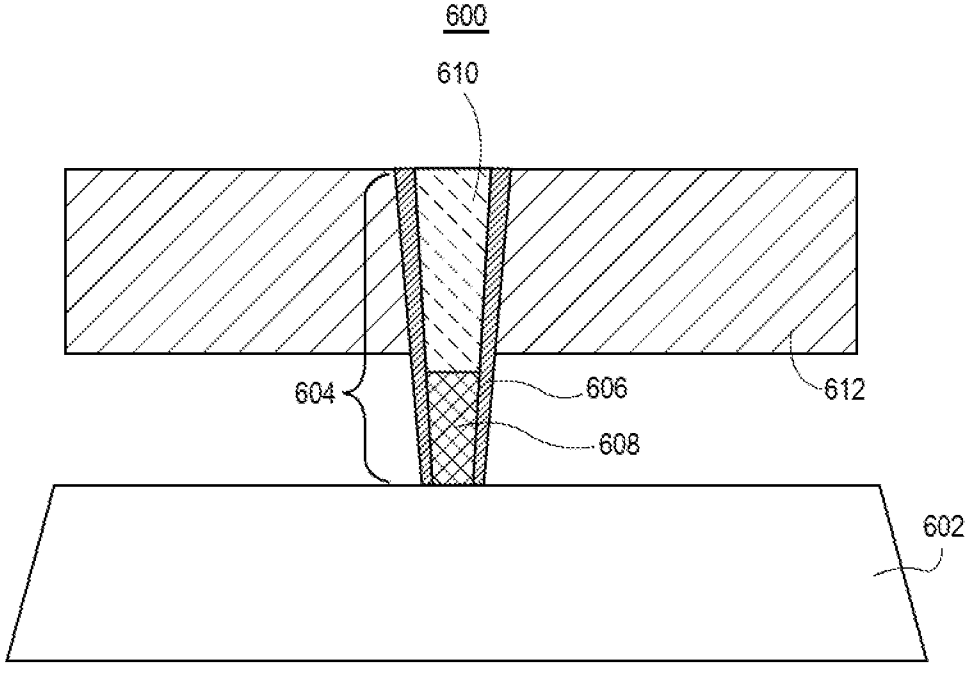
FIG. 6 illustrates a cross-sectional view of a portion of a recessed boundary deep via (DVB) in a location between gate structures, in accordance with an embodiment of the present disclosure.

A recessed DVB can be full thickness in some locations, and recessed in other locations. As an example, FIG. 5 illustrates a cross-sectional view of a portion of a recessed boundary deep via (DVB) in a location between source or drain structures, in accordance with an embodiment of the present disclosure. FIG. 6 illustrates a cross-sectional view of a portion of a recessed boundary deep via (DVB) in a location between gate structures, in accordance with an embodiment of the present disclosure. It is to be appreciated that the structures 500 and 600 of FIGS. 5 and 6, respectively, can be continuous with one another, e.g., with the structure of one into the page relative to the other, and that the described recessed DVB portions of FIGS. 5 and 6 can be continuous with one another.

Referring to FIG. 5, an integrated circuit structure 500 includes source or drain structures 512, a recessed boundary deep via (DVB) 504, front-side local interconnects 514, and a backside metal routing layer 502 (BM0 layer). In one embodiment, the recessed DVB 504 includes a pillar portion 510 and a line portion 508, with the pillar portion having a dimension into and out of the page less than a dimension of the line portion into and out of the page. In one embodiment, a dielectric liner 506, such as silicon nitride liner, is along sides of the pillar portion 510 and the line portion 508, as is depicted.

Referring to FIG. 6, an integrated circuit structure 600 includes source or gate line portions 612, a recessed boundary deep via (DVB) 604, and a backside metal routing layer 602 (BM0 layer). In one embodiment, the recessed DVB 604 includes only a line portion 608 at this location. A dielectric plug 610, such as a gate cut plug, is on the line portion 608 at this location. In one embodiment, a dielectric liner 606, such as silicon nitride liner, is along sides of the dielectric plug 610 and the line portion 608, as is depicted.

With reference again to FIGS. 5 and 6, in an embodiment, a recess for the DVB can be detected by the pillar like protrusions from a lowered wall of via that is connected to the backside metal. The backside metal may run orthogonal or parallel to the DVB.

Figure 7:
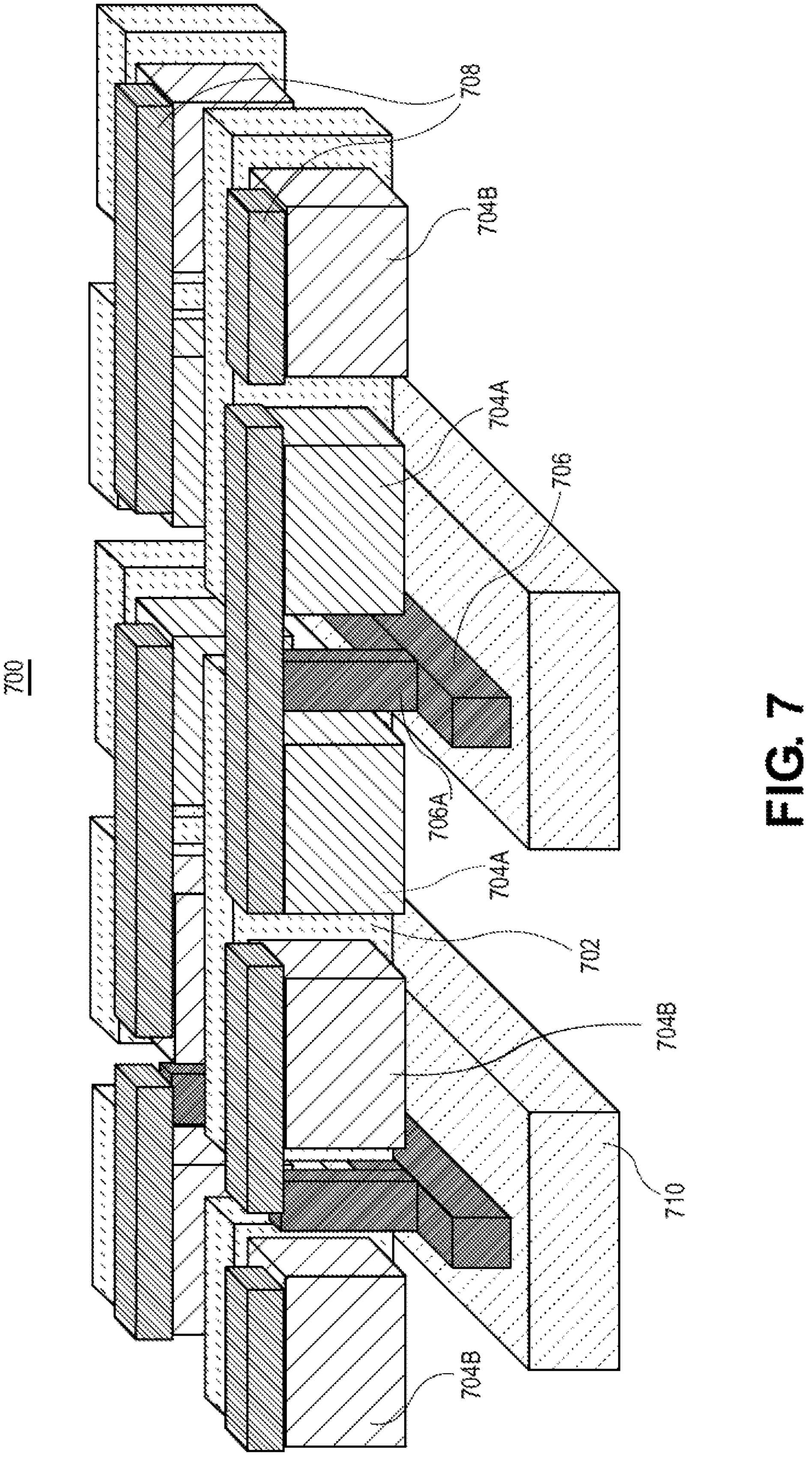
FIG. 7 illustrates an angled cross-sectional view of an integrated circuit structure having a recessed boundary deep via (DVB) architecture, in accordance with an embodiment of the present disclosure.

As an exemplary architecture, FIG. 7 illustrates an angled cross-sectional view of an integrated circuit structure having a recessed boundary deep via (DVB) architecture, in accordance with an embodiment of the present disclosure.

Referring to FIG. 7, an integrated circuit structure 700 includes gate lines 702, N-type source or drain structures 704A, P-type source or drain structures 704B, recessed boundary deep vias (DVBs) 706/706A, front-side local interconnects 708, and backside metal routing layers 710 (BM0 layers). In one embodiment, the recessed boundary deep vias (DVBs) are formed using a self-aligned process scheme.

With reference again to FIG. 7, in accordance with one or more embodiments of the present disclosure, an integrated circuit structure 700 includes a plurality of gate lines 702. In one embodiment, the plurality of gate lines 702 is extending over a plurality of semiconductor nanowire stack channel structures (which may also refer to nanoribbon structures or nanosheet structures). In another embodiment, the plurality of gate lines 702 is extending over a plurality of semiconductor fin structures.

The integrated circuit structure 700 also includes a plurality of trench contacts 708 extending over a plurality of source or drain structures 704A/704B, individual ones of the plurality of trench contacts 708 alternating with individual ones of the plurality of gate lines 702. A backside metal routing layer 710 is extending beneath one or more of the plurality of gate lines 702 and beneath one or more of the plurality of trench contacts 708. A conductive structure 706/706A couples the backside metal routing layer 710 to one of the one or more of the plurality of trench contacts 708. The conductive structure 706/706A includes a pillar portion 706A in contact with the one of the one or more of the plurality of trench contacts 708, the pillar portion 706A on a line portion 706, the line portion 706 in contact with and extending along the backside metal routing layer 710.

In an embodiment, the backside metal routing layer 710 is a backside power delivery line. In an embodiment, the conductive structure 706A/706 is a recessed boundary deep via structure.

In an embodiment, the pillar portion 706A of the conductive structure 706/706A extends between a pair of N-type source or drain structures 704A of plurality of source or drain structures 704A/704B, as is depicted for the right-hand conductive structure 706/706A. In an embodiment, the pillar portion 706A of the conductive structure 706/706A extends between a pair of P-type source or drain structures 704B of plurality of source or drain structures 704A/704B.

Figure 8A:
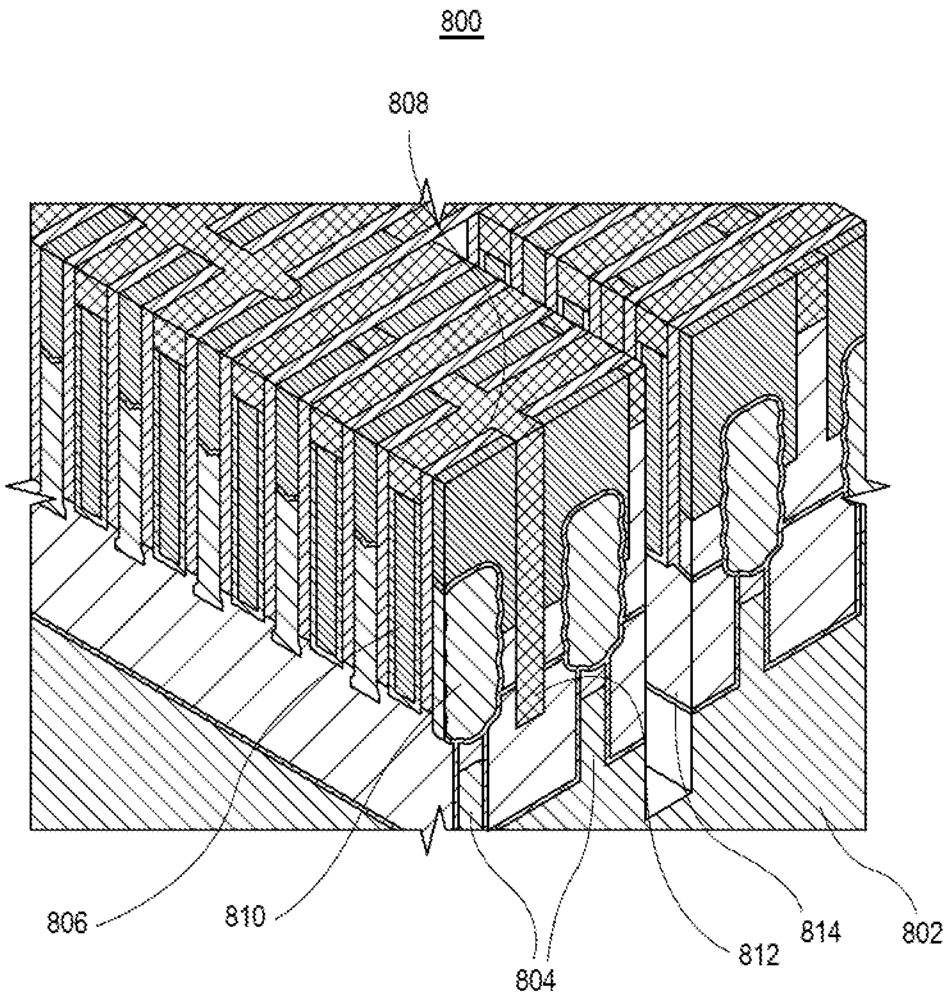
FIGS. 8A-8C illustrate angled cross-sectional views representing various operations in a method of fabricating an integrated circuit structure having a recessed boundary deep via (DVB) architecture, in accordance with an embodiment of the present disclosure.
Figure 8B:
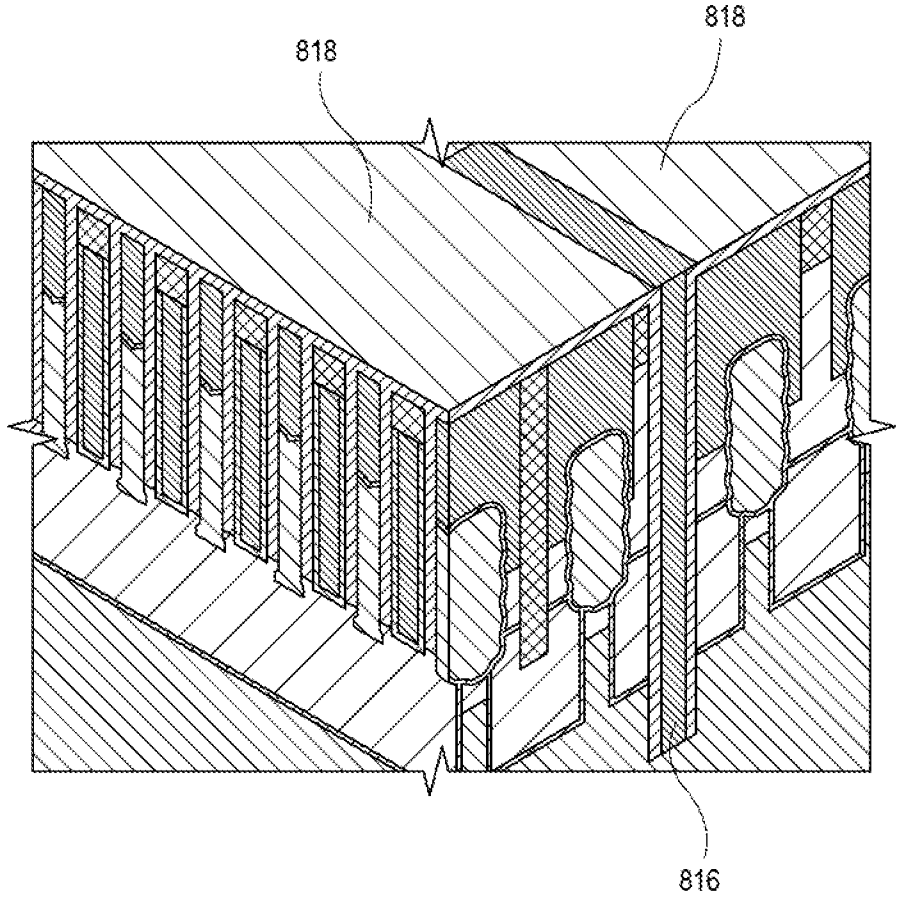
Figure 8C:
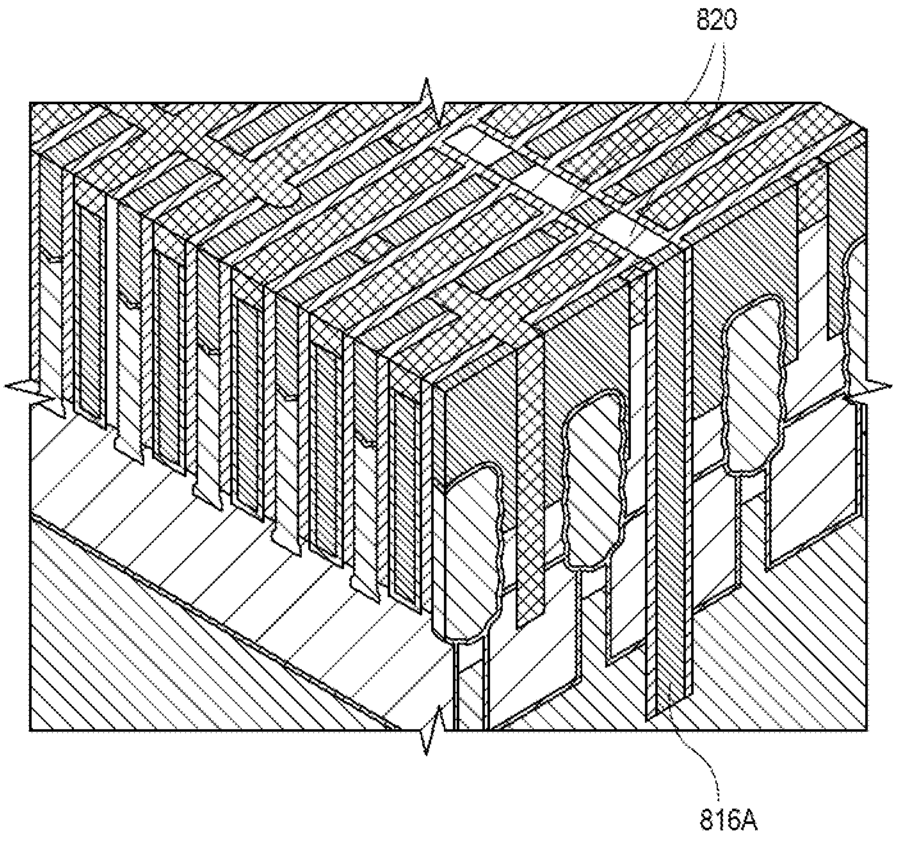
Figure 9:
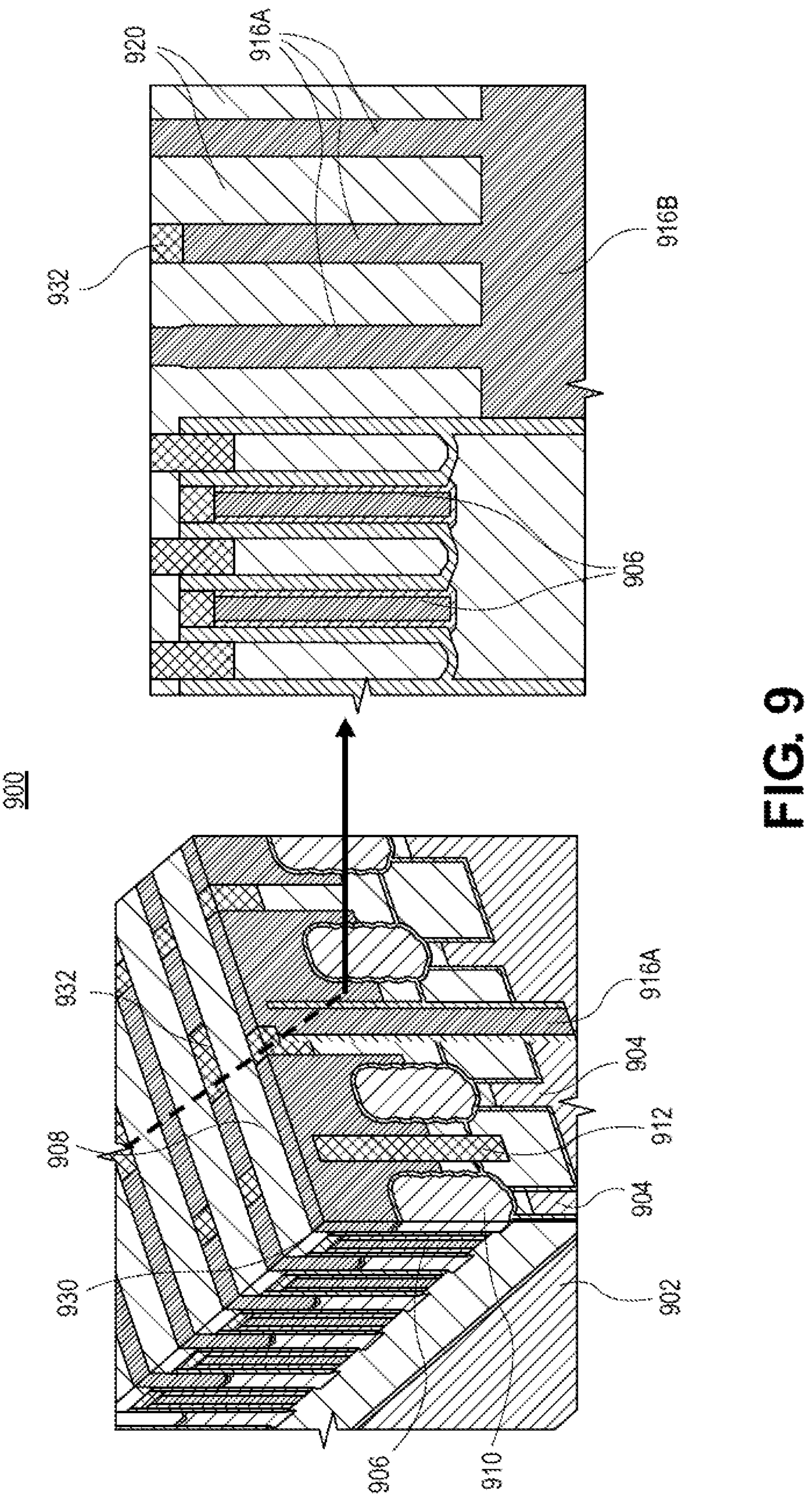
FIG. 9 illustrates an angled cross-sectional view and a planar cross-sectional view of an integrated circuit structure having a recessed boundary deep via (DVB) architecture, in accordance with an embodiment of the present disclosure.

As an exemplary processing scheme, FIGS. 8A-8C illustrate angled cross-sectional views representing various operations in a method of fabricating an integrated circuit structure having a recessed boundary deep via (DVB) architecture, in accordance with an embodiment of the present disclosure. FIG. 9 illustrates an angled cross-sectional view and a planar cross-sectional view of an integrated circuit structure having a recessed boundary deep via (DVB) architecture, in accordance with an embodiment of the present disclosure.

Referring to FIG. 8A, a starting structure 800 includes a plurality of fins or subfins 804 on a substrate 802. The fins may be for FinFET devices, or may be sub-fins beneath a stack of nanowires. A plurality of gate lines 806 (e.g., each including a metal gate and high-k gate dielectric) is over the plurality of fins or sub-fins 804. An insulating cap 808 is on the plurality of gate lines 806. Epitaxial source or drain structures 810 alternate with the plurality of gate lines 806. Dielectric gate cut plugs 812 can cut certain ones of the plurality of gate lines 806. A trench 814 is etched in a location where a recessed boundary deep via is to be formed.

Referring to FIG. 8B, a protective helmet layer 818 is formed on the structure 800. A conductive fill material 816 is formed in the trench 814. The structure 816 can effectively be viewed as a non-recessed boundary deep via.

Referring to FIG. 8C, the conductive fill material 816 is recessed in select locations to provide a recessed boundary deep via structure 816A having intersecting dielectric plug portions 820.

Referring to FIG. 9, a structure 900 resulting from the above process can include a plurality of fins or sub-fins 904 on a substrate 902. The fins may be for FinFET devices, or may be sub-fins beneath a stack of nanowires. A plurality of gate lines 906 (e.g., each including a metal gate and high-k gate dielectric) is over the plurality of fins or sub-fins 904. An insulating cap 908 is on the plurality of gate lines 906. Epitaxial source or drain structures 910 alternate with the plurality of gate lines 906. The structure includes a recessed boundary deep via structure 916A having intersecting dielectric plug portions 920. Trench contact structures 930 and trench contact plugs 932 can also be included. From the perspective on the right, the lower line portion 916B of the recessed boundary deep via structure 916A is viewable. In one embodiment, the boundary deep via structure 916A or power rail is self-aligned to the gate/S/D cut by a dielectric liner. In one embodiment, metal within rail is recessed everywhere except to a connection to the above metal layer/contact.

In another aspect, contact over active gate (COAG) structures and processes are described, e.g., a structures that may further enable compaction of a cell architecture that includes recessed trench contacts and deep boundary vias. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In accordance with one or more embodiments, tapered gate and trench contacts are implemented to enable COAG fabrication. Embodiments may be implemented to enable patterning at tight pitches.

To provide further background for the importance of a COAG processing scheme, in technologies where space and layout constraints are somewhat relaxed compared with current generation space and layout constraints, a contact to gate structure may be fabricated by making contact to a portion of the gate electrode disposed over an isolation region. As an example, FIG. 10A illustrates a plan view of a semiconductor device having a gate contact disposed over an inactive portion of a gate electrode.

Figures 10A, 11A:
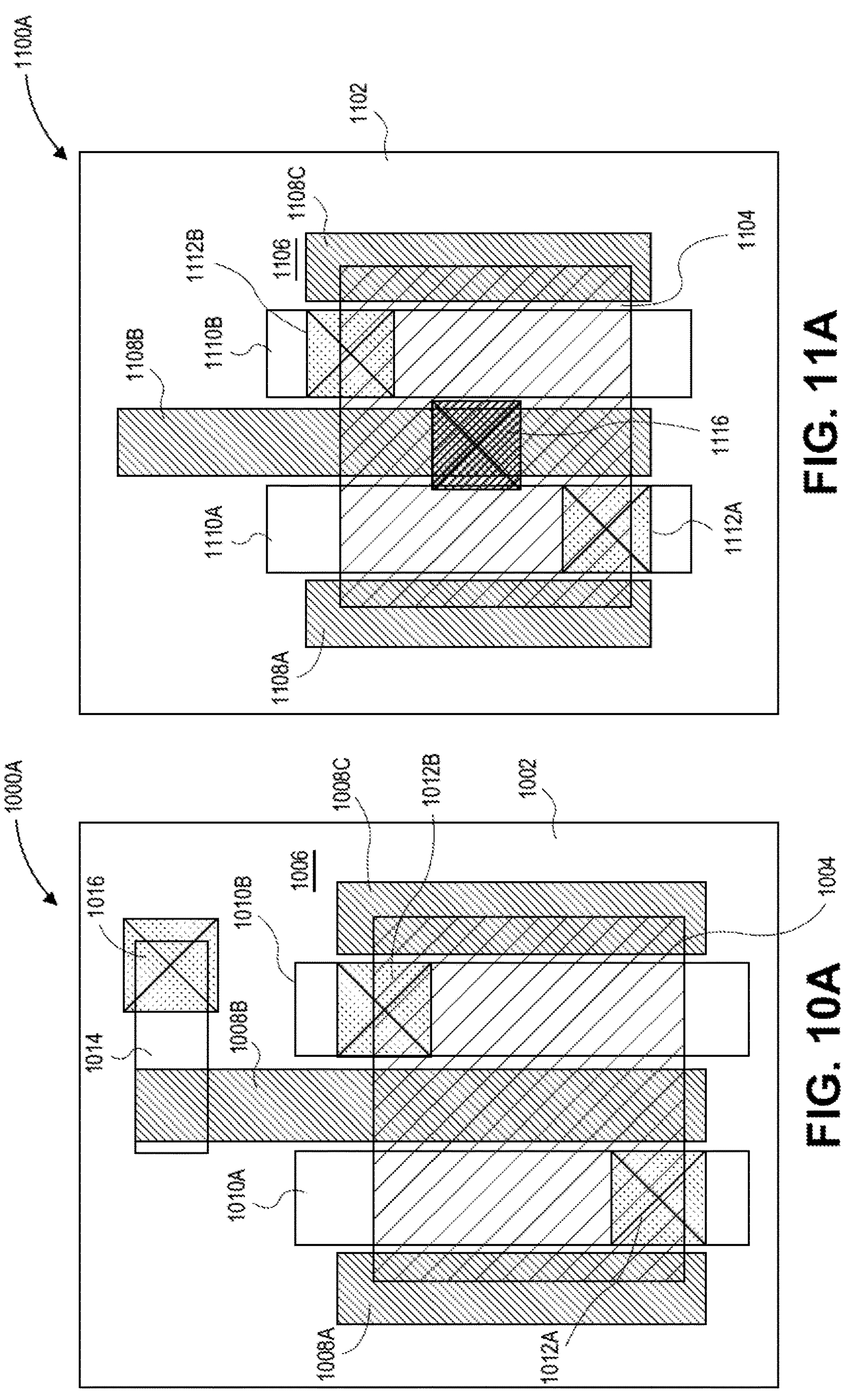
FIG. 10A illustrates a plan view of a semiconductor device having a gate contact disposed over an inactive portion of a gate electrode.
FIG. 11A illustrates a plan view of a semiconductor device having a gate contact via disposed over an active portion of a gate electrode, in accordance with an embodiment of the present disclosure.

Referring to FIG. 10A, a semiconductor structure or device 1000A includes a diffusion or active region 1004 disposed in a substrate 1002, and within an isolation region 1006. One or more gate lines (also known as poly lines), such as gate lines 1008A, 1008B and 1008C are disposed over the diffusion or active region 1004 as well as over a portion of the isolation region 1006. Source or drain contacts (also known as trench contacts), such as contacts 1010A and 1010B, are disposed over source and drain regions of the semiconductor structure or device 1000A. Trench contact vias 1012A and 1012B provide contact to trench contacts 1010A and 1010B, respectively. A separate gate contact 1014, and overlying gate contact via 1016, provides contact to gate line 1008B. In contrast to the source or drain trench contacts 1010A or 1010B, the gate contact 1014 is disposed, from a plan view perspective, over isolation region 1006, but not over diffusion or active region 1004. Furthermore, neither the gate contact 1014 nor gate contact via 1016 is disposed between the source or drain trench contacts 1010A and 1010B.

Figures 10B, 11B:
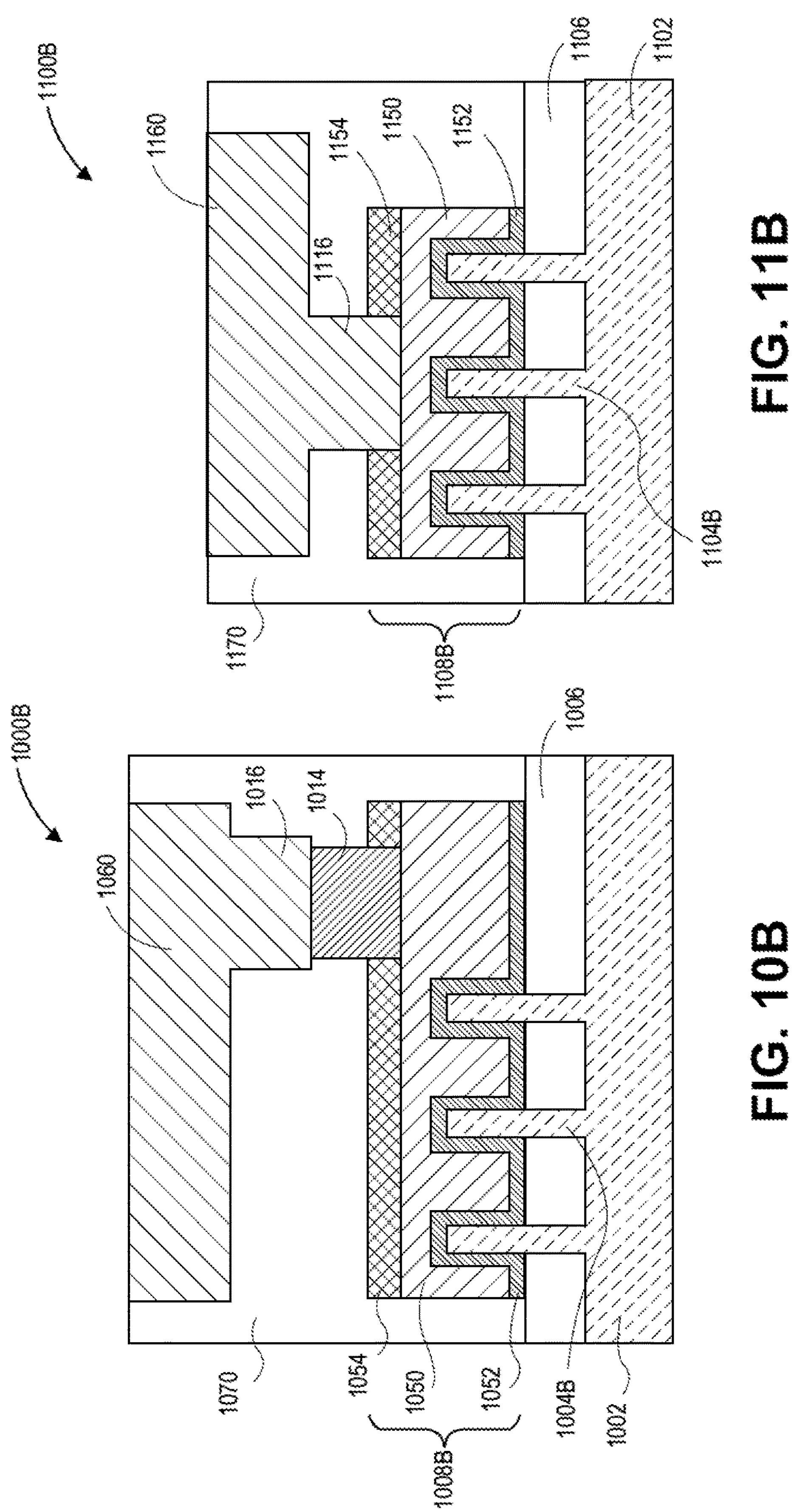
FIG. 10B illustrates a cross-sectional view of a non-planar semiconductor device having a gate contact disposed over an inactive portion of a gate electrode.
FIG. 11B illustrates a cross-sectional view of a non-planar semiconductor device having a gate contact via disposed over an active portion of a gate electrode, in accordance with an embodiment of the present disclosure.

FIG. 10B illustrates a cross-sectional view of a non-planar semiconductor device having a gate contact disposed over an inactive portion of a gate electrode. Referring to FIG. 10B, a semiconductor structure or device 1000B, e.g. a non-planar version of device 1000A of FIG. 10A, includes a non-planar diffusion or active region 1004B (e.g., a fin structure) formed from substrate 1002, and within isolation region 1006. Gate line 1008B is disposed over the non-planar diffusion or active region 1004B as well as over a portion of the isolation region 1006. As shown, gate line 1008B includes a gate electrode 1050 and gate dielectric layer 1052, along with a dielectric cap layer 1054. Gate contact 1014, and overlying gate contact via 1016 are also seen from this perspective, along with an overlying metal interconnect 1060, all of which are disposed in inter-layer dielectric stacks or layers 1070. Also seen from the perspective of FIG. 10B, the gate contact 1014 is disposed over isolation region 1006, but not over non-planar diffusion or active region 1004B.

Referring again to FIGS. 10A and 10B, the arrangement of semiconductor structure or device 1000A and 1000B, respectively, places the gate contact over isolation regions. Such an arrangement wastes layout space. However, placing the gate contact over active regions would require either an extremely tight registration budget or gate dimensions would have to increase to provide enough space to land the gate contact. Furthermore, historically, contact to gate over diffusion regions has been avoided for risk of drilling through other gate material (e.g., polysilicon) and contacting the underlying active region. One or more embodiments described herein address the above issues by providing feasible approaches, and the resulting structures, to fabricating contact structures that contact portions of a gate electrode formed over a diffusion or active region.

As an example, FIG. 11A illustrates a plan view of a semiconductor device having a gate contact via disposed over an active portion of a gate electrode, in accordance with an embodiment of the present disclosure. Referring to FIG. 11A, a semiconductor structure or device 1100A includes a diffusion or active region 1104 disposed in a substrate 1102, and within an isolation region 1106. One or more gate lines, such as gate lines 1108A, 1108B and 1108C are disposed over the diffusion or active region 1104 as well as over a portion of the isolation region 1106. Source or drain trench contacts, such as trench contacts 1110A and 1110B, are disposed over source and drain regions of the semiconductor structure or device 1100A. Trench contact vias 1112A and 1112B provide contact to trench contacts 1110A and 1110B, respectively. A gate contact via 1116, with no intervening separate gate contact layer, provides contact to gate line 1108B. In contrast to FIG. 10A, the gate contact 1116 is disposed, from a plan view perspective, over the diffusion or active region 1104 and between the source or drain contacts 1110A and 1110B.

FIG. 11B illustrates a cross-sectional view of a non-planar semiconductor device having a gate contact via disposed over an active portion of a gate electrode, in accordance with an embodiment of the present disclosure. Referring to FIG. 11B, a semiconductor structure or device 1100B, e.g. a non-planar version of device 1100A of FIG. 11A, includes a non-planar diffusion or active region 1104B (e.g., a fin structure) formed from substrate 1102, and within isolation region 1106. Gate line 1108B is disposed over the non-planar diffusion or active region 1104B as well as over a portion of the isolation region 1106. As shown, gate line 1108B includes a gate electrode 1150 and gate dielectric layer 1152, along with a dielectric cap layer 1154. The gate contact via 1116 is also seen from this perspective, along with an overlying metal interconnect 1160, both of which are disposed in inter-layer dielectric stacks or layers 1170. Also seen from the perspective of FIG. 11B, the gate contact via 1116 is disposed over non-planar diffusion or active region 1104B.

Thus, referring again to FIGS. 11A and 11B, in an embodiment, trench contact vias 1112A, 1112B and gate contact via 1116 are formed in a same layer and are essentially co-planar. In comparison to FIGS. 10A and 10B, the contact to the gate line would otherwise include and additional gate contact layer, e.g., which could be run perpendicular to the corresponding gate line. In the structure(s) described in association with FIGS. 11A and 11B, however, the fabrication of structures 1100A and 1100B, respectively, enables the landing of a contact directly from a metal interconnect layer on an active gate portion without shorting to adjacent source drain regions. In an embodiment, such an arrangement provides a large area reduction in circuit layout by eliminating the need to extend transistor gates on isolation to form a reliable contact. As used throughout, in an embodiment, reference to an active portion of a gate refers to that portion of a gate line or structure disposed over (from a plan view perspective) an active or diffusion region of an underlying substrate. In an embodiment, reference to an inactive portion of a gate refers to that portion of a gate line or structure disposed over (from a plan view perspective) an isolation region of an underlying substrate.

In an embodiment, the semiconductor structure or device 1100 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 1108A and 1108B surround at least a top surface and a pair of sidewalls of the three-dimensional body. In another embodiment, at least the channel region is made to be a discrete three-dimensional body, such as in a gate-all-around device. In one such embodiment, the gate electrode stacks of gate lines 1108A and 1108B each completely surrounds the channel region.

Generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and introducing an additional dielectric material in the process flow (e.g., trench insulating layer (TILA)). The additional dielectric material is included as a trench contact dielectric cap layer with etch characteristics different from the gate dielectric material cap layer used for trench contact alignment in a gate aligned contact process (GAP) processing scheme (e.g., use of a gate insulating layer (GILA)).

As an exemplary fabrication scheme, a starting structure includes one or more gate stack structures disposed above a substrate. The gate stack structures may include a gate dielectric layer and a gate electrode. Trench contacts, e.g., contacts to diffusion regions of the substrate or to epitaxial region formed within the substrate are spaced apart from gate stack structures by dielectric spacers. An insulating cap layer may be disposed on the gate stack structures (e.g., GILA). In one embodiment, contact blocking regions or "contact plugs", which may be fabricated from an inter-layer dielectric material, are included in regions where contact formation is to be blocked.

In an embodiment, the contact pattern is essentially perfectly aligned to an existing gate pattern while eliminating the use of a lithographic operation with exceedingly tight registration budget. In one such embodiment, this approach enables the use of intrinsically highly selective wet etching (or anisotropic dry etch processes some of which are non-plasma, gas phase isotropic etches (e.g., versus classic dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. This also allows for perfect or near-perfect self-alignment with a larger edge placement error margin. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structures may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including $SF_6$. In another embodiment, dummy gates are composed of polycrystalline silicon or amorphous silicon and are removed with a wet etch process including aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Next, the trench contacts may be recessed to provide recessed trench contacts that have a height below the top surface of adjacent spacers. An insulating cap layer is then formed on the recessed trench contacts (e.g., TILA). In accordance with an embodiment of the present disclosure, the insulating cap layer on the recessed trench contacts is composed of a material having a different etch characteristic than insulating cap layer on the gate stack structures.

The trench contacts may be recessed by a process selective to the materials of the spacers and the gate insulating cap layer. For example, in one embodiment, the trench contacts are recessed by an etch process such as a wet etch process or dry etch process. The trench contact insulating cap layer may be formed by a process suitable to provide a conformal and sealing layer above the exposed portions of the trench contacts. For example, in one embodiment, the trench contact insulating cap layer is formed by a chemical vapor deposition (CVD) process as a conformal layer above the entire structure. The conformal layer is then planarized, e.g., by chemical mechanical polishing (CMP), to provide the trench contact insulating cap layer material only above the recessed trench contacts.

Regarding suitable material combinations for gate or trench contact insulating cap layers, in one embodiment, one of the pair of gate versus trench contact insulating cap material is composed of silicon oxide while the other is composed of silicon nitride. In another embodiment, one of the pair of gate versus trench contact insulating cap material is composed of silicon oxide while the other is composed of carbon doped silicon nitride. In another embodiment, one of the pair of gate versus trench contact insulating cap material is composed of silicon oxide while the other is composed of silicon carbide. In another embodiment, one of the pair of gate versus trench contact insulating cap material is composed of silicon nitride while the other is composed of carbon doped silicon nitride. In another embodiment, one of the pair of gate versus trench contact insulating cap material is composed of silicon nitride while the other is composed of silicon carbide. In another embodiment, one of the pair of gate versus trench contact insulating cap material is composed of carbon doped silicon nitride while the other is composed of silicon carbide.

In another aspect, nanowire or nanoribbon structures are described. Nanowire or nanoribbon release processing may be performed through a replacement gate trench. Examples of such release processes are described below. Additionally, in yet another aspect, backend (BE) interconnect scaling can result in lower performance and higher manufacturing cost due to patterning complexity. Embodiments described herein may be implemented to enable front-side and back-side interconnect integration for nanowire transistors. Embodiments described herein may provide an approach to achieve a relatively wider interconnect pitch. The result may be improved product performance and lower patterning costs. Embodiments may be implemented to enable robust functionality of scaled nanowire or nanoribbon transistors with low power and high performance.

One or more embodiments described herein are directed dual epitaxial (EPI) connections for nanowire or nanoribbon transistors using partial source or drain (SD) and asymmetric trench contact (TCN) depth. In an embodiment, an integrated circuit structure is fabricated by forming source-drain openings of nanowire/nanoribbon transistors which are partially filled with SD epitaxy. A remainder of the opening is filled with a conductive material. Deep trench formation on one of the source or drain side enables direct contact to a back-side interconnect level.

As an exemplary process flow for fabricating another gate-all-around device, FIGS. 12A-12J illustrates cross-sectional views of various operations in a method of fabricating a gate-all-around integrated circuit structure, in accordance with an embodiment of the present disclosure.

Figure 12B:
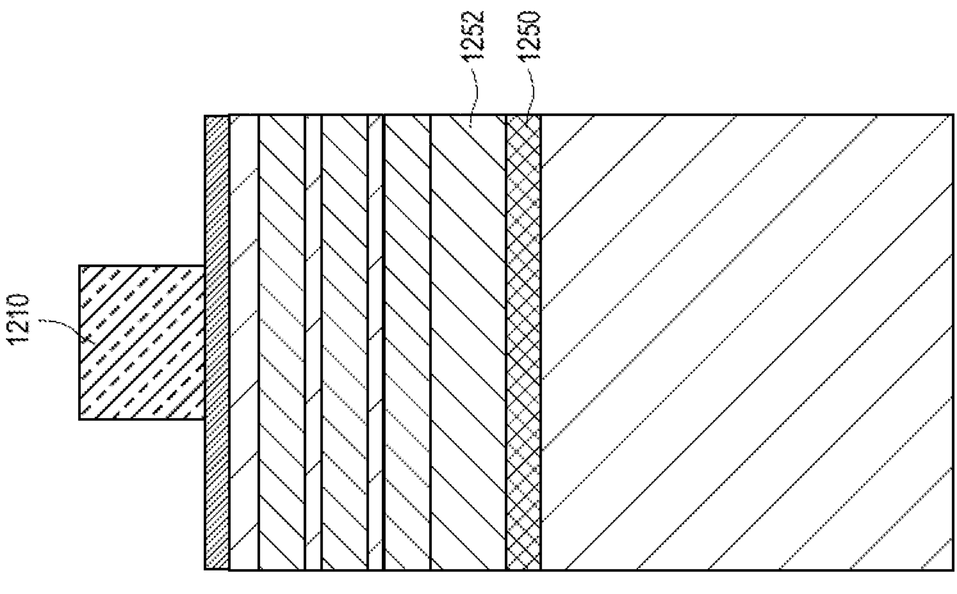
Figure 12A:
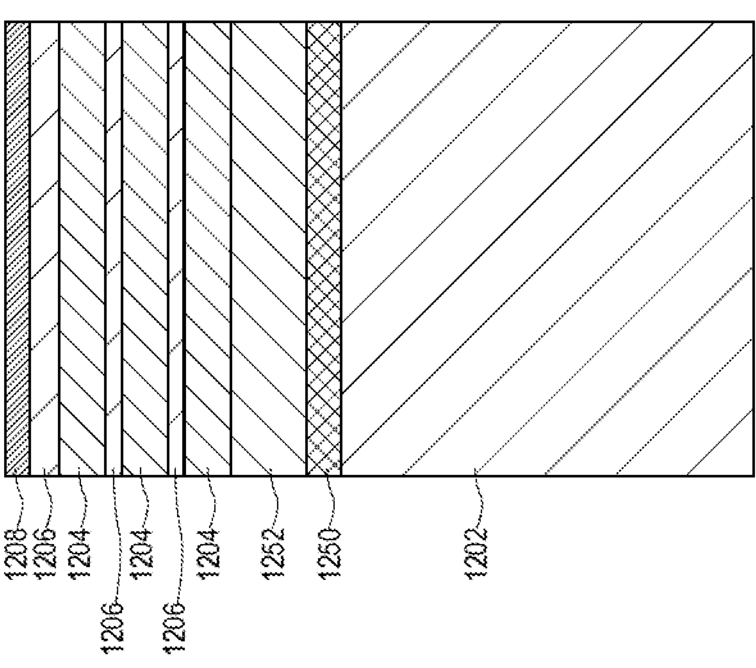

Referring to FIG. 12A, a method of fabricating an integrated circuit structure includes forming a starting stack which includes alternating sacrificial layers 1204 and nanowires 1206 above a fin 1202, such as a silicon fin. The nanowires 1206 may be referred to as a vertical arrangement of nanowires. A protective cap 1208 may be formed above the alternating sacrificial layers 1204 and nanowires 1206, as is depicted. A relaxed buffer layer 1252 and a defect modification layer 1250 may be formed beneath the alternating sacrificial layers 1204 and nanowires 1206, as is also depicted.

Referring to FIG. 12B, a gate stack 1210 is formed over the vertical arrangement of horizontal nanowires 1206. Portions of the vertical arrangement of horizontal nanowires 1206 are then released by removing portions of the sacrificial layers 1204 to provide recessed sacrificial layers 1204' and cavities 1212, as is depicted in FIG. 12C.

It is to be appreciated that the structure of FIG. 12C may be fabricated to completion without first performing the deep etch and asymmetric contact processing described below. In either case (e.g., with or without asymmetric contact processing), in an embodiment, a fabrication process involves use of a process scheme that provides a gate-all-around integrated circuit structure having epitaxial nubs, which may be vertically discrete source or drain structures.

Figure 12D:
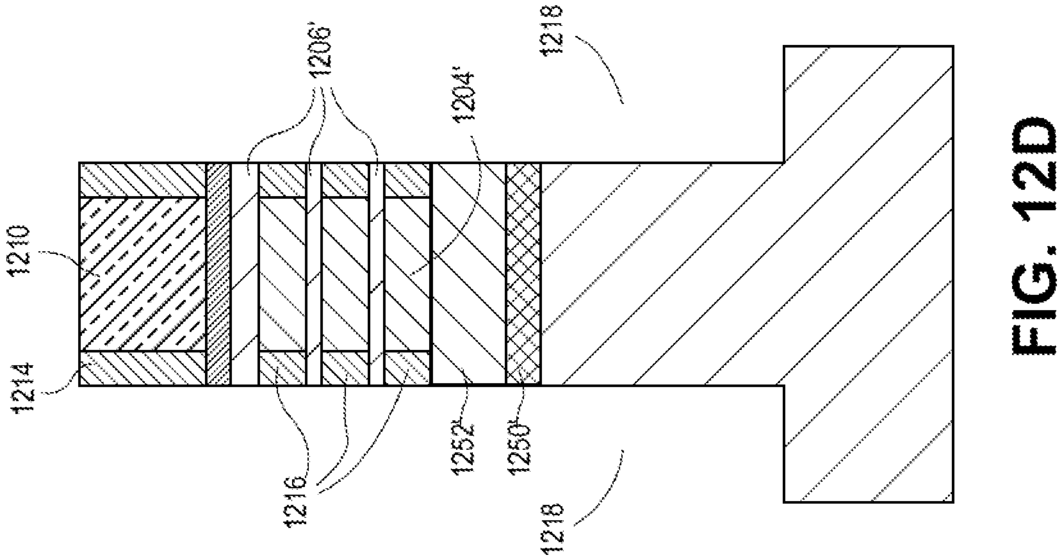
Figure 12C:
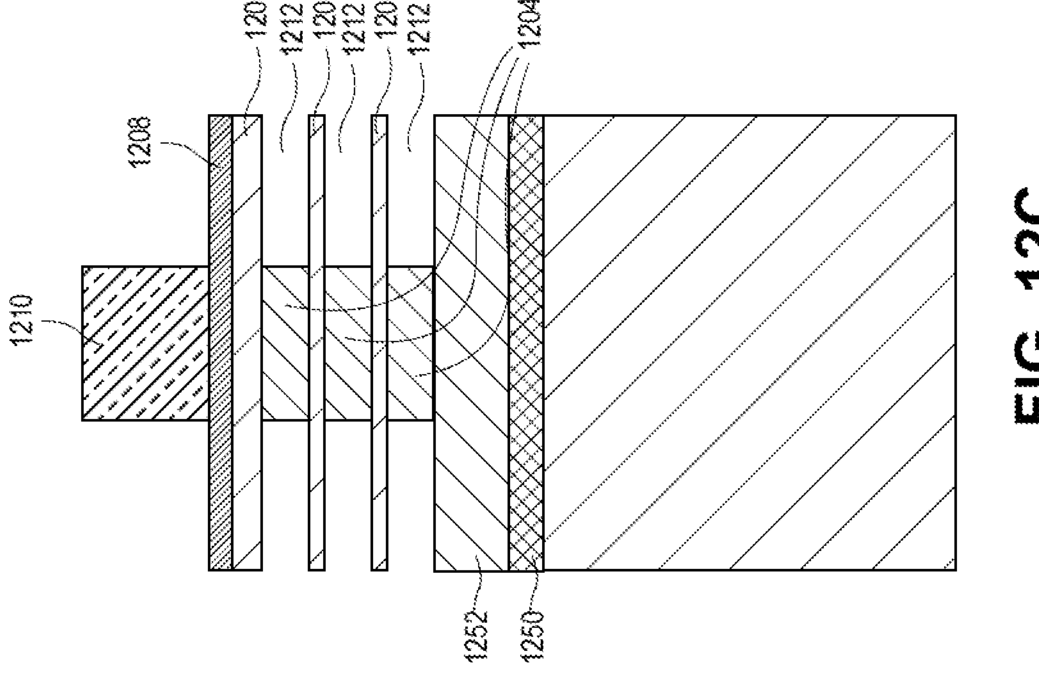

Referring to FIG. 12D, upper gate spacers 1214 are formed at sidewalls of the gate structure 1210. Cavity spacers 1216 are formed in the cavities 1212 beneath the upper gate spacers 1214. A deep trench contact etch is then optionally performed to form trenches 1218 and to form recessed nanowires 1206'. A patterned relaxed buffer layer 1252' and a patterned defect modification layer 1250' may also be present, as is depicted.

Figures 12E, 12F, 12G:
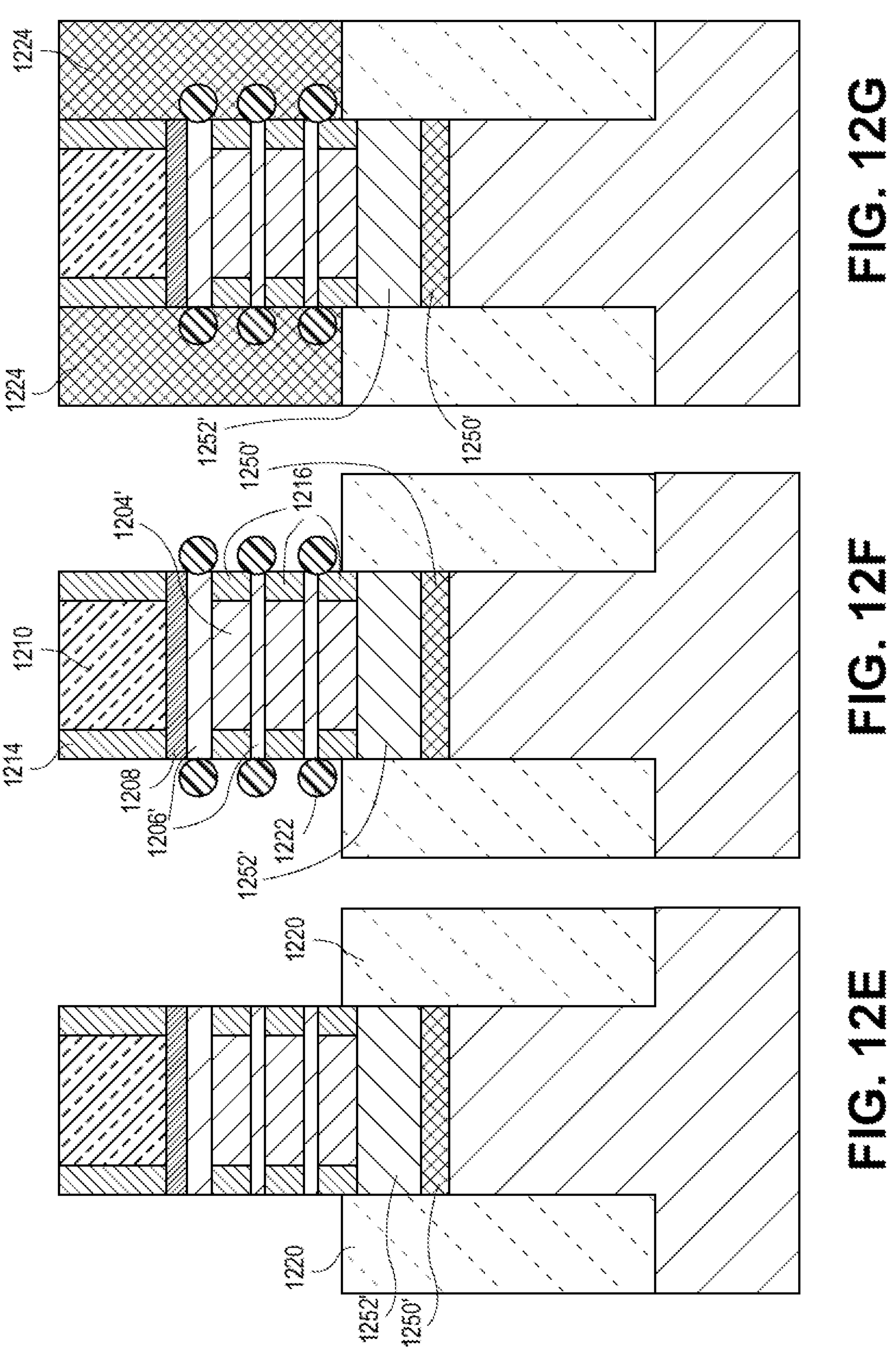

A sacrificial material 1220 is then formed in the trenches 1218, as is depicted in FIG. 12E. In other process schemes, an isolated trench bottom or silicon trench bottom may be used.

Referring to FIG. 12F, a first epitaxial source or drain structure (e.g., left-hand features 1222) is formed at a first end of the vertical arrangement of horizontal nanowires 1206'. A second epitaxial source or drain structure (e.g., right-hand features 1222) is formed at a second end of the vertical arrangement of horizontal nanowires 1206'. In an embodiment, as depicted, the epitaxial source or drain structures 1222 are vertically discrete source or drain structures and may be referred to as epitaxial nubs.

An inter-layer dielectric (ILD) material 1224 is then formed at the sides of the gate electrode 1210 and adjacent the source or drain structures 1222, as is depicted in FIG. 12G. Referring to FIG. 12H, a replacement gate process is used to form a permanent gate dielectric 1228 and a permanent gate electrode 1226. The ILD material 1224 is then removed, as is depicted in FIG. 12I. The sacrificial material 1220 is then removed from one of the source drain locations (e.g., right-hand side) to form trench 1232, but is not removed from the other of the source drain locations to form trench 1230.

Referring to FIG. 12J, a first conductive contact structure 1234 is formed coupled to the first epitaxial source or drain structure (e.g., left-hand features 1222). A second conductive contact structure 1236 is formed coupled to the second epitaxial source or drain structure (e.g., right-hand features 1222). The second conductive contact structure 1236 is formed deeper along the fin 1202 than the first conductive contact structure 1234. In an embodiment, although not depicted in FIG. 12J, the method further includes forming an exposed surface of the second conductive contact structure 1236 at a bottom of the fin 1202. Conductive contacts may include a contact resistance reducing layer and a primary contact electrode layer, where examples can include Ti, Ni, Co (for the former and W, Ru, Co for the latter.)

In an embodiment, the second conductive contact structure 1236 is deeper along the fin 1202 than the first conductive contact structure 1234, as is depicted. In one such embodiment, the first conductive contact structure 1234 is not along the fin 1202, as is depicted. In another such embodiment, not depicted, the first conductive contact structure 1234 is partially along the fin 1202.

In an embodiment, the second conductive contact structure 1236 is along an entirety of the fin 1202. In an embodiment, although not depicted, in the case that the bottom of the fin 1202 is exposed by a back-side substrate removal process, the second conductive contact structure 1236 has an exposed surface at a bottom of the fin 1202.

In another aspect, in order to enable access to both conductive contact structures of a pair of asymmetric source and drain contact structures, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back-side, and again employed in back-side fabrication. Processing of both a front-side and revealed back-side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 μm in thickness, 100-700 μm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, back-side processing may commence on an exposed back-side of the device layer or specific device regions there in. In some embodiments, the back-side device layer processing includes a further polish or wet/dry etch through a thickness of the device layer disposed between the intervening layer and a device region previously fabricated in the device layer, such as a source or drain region.

In some embodiments where the carrier layer, intervening layer, or device layer back-side is recessed with a wet and/or plasma etch, such an etch may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back-side of an intervening layer, a back-side of the device layer, and/or back-side of one or more semiconductor regions within the device layer, and/or front-side metallization revealed. Additional back-side processing of any of these revealed regions may then be performed during downstream processing.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a “U”-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a “U”-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a predefined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

In an embodiment, a blanket film is patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented. In any case, in an embodiment, a gridded layout may be fabricated by a selected lithography approach, such as 193 nm immersion lithography (193i). Pitch division may be implemented to increase the density of lines in the gridded layout by a factor of n. Gridded layout formation with 193i lithography plus pitch division by a factor of 'n' can be designated as 193i+P/n Pitch Division. In one such embodiment, 193 nm immersion scaling can be extended for many generations with cost effective pitch division.

It is also to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, a FIN-FET, a nanowire, or a nanoribbon. One or more embodiments may be particularly useful for fabricating semiconductor devices at a 10 nanometer (10 nm) technology node or sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 13:
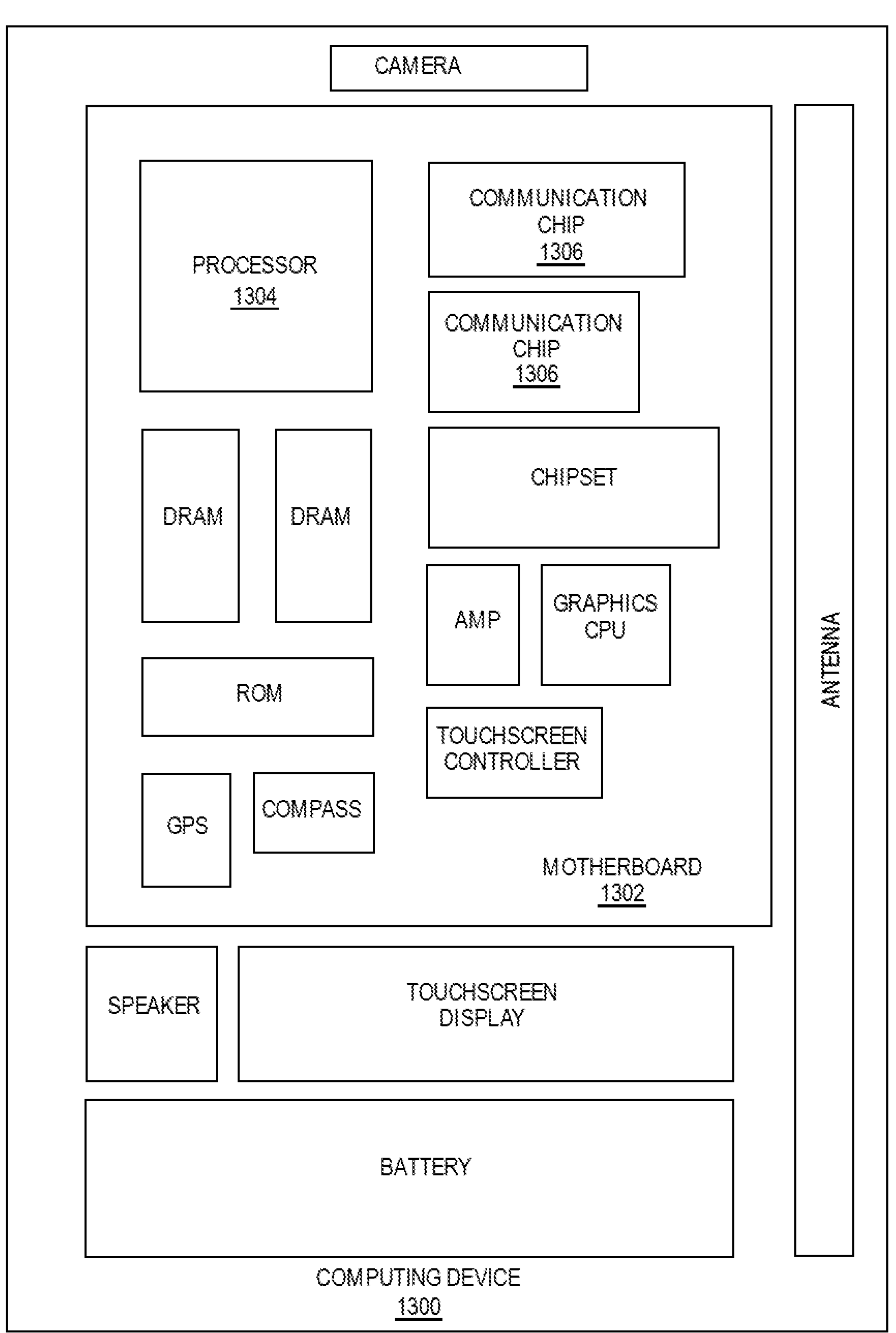
FIG. 13 illustrates a computing device in accordance with one implementation of the disclosure.

FIG. 13 illustrates a computing device 1300 in accordance with one implementation of the disclosure. The computing device 1300 houses a board 1302. The board 1302 may include a number of components, including but not limited to a processor 1304 and at least one communication chip 1306. The processor 1304 is physically and electrically coupled to the board 1302. In some implementations the at least one communication chip 1306 is also physically and electrically coupled to the board 1302. In further implementations, the communication chip 1306 is part of the processor 1304.

Depending on its applications, computing device 1300 may include other components that may or may not be physically and electrically coupled to the board 1302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1306 enables wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

The processor 1304 of the computing device 1300 includes an integrated circuit die packaged within the processor 1304. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 1306 also includes an integrated circuit die packaged within the communication chip 1306. In accordance with another implementation of the disclosure, the integrated circuit die of the communication chip is built in accordance with implementations of the disclosure.

In further implementations, another component housed within the computing device 1300 may contain an integrated circuit die built in accordance with implementations of embodiments of the disclosure.

In various embodiments, the computing device 1300 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

Figure 14:
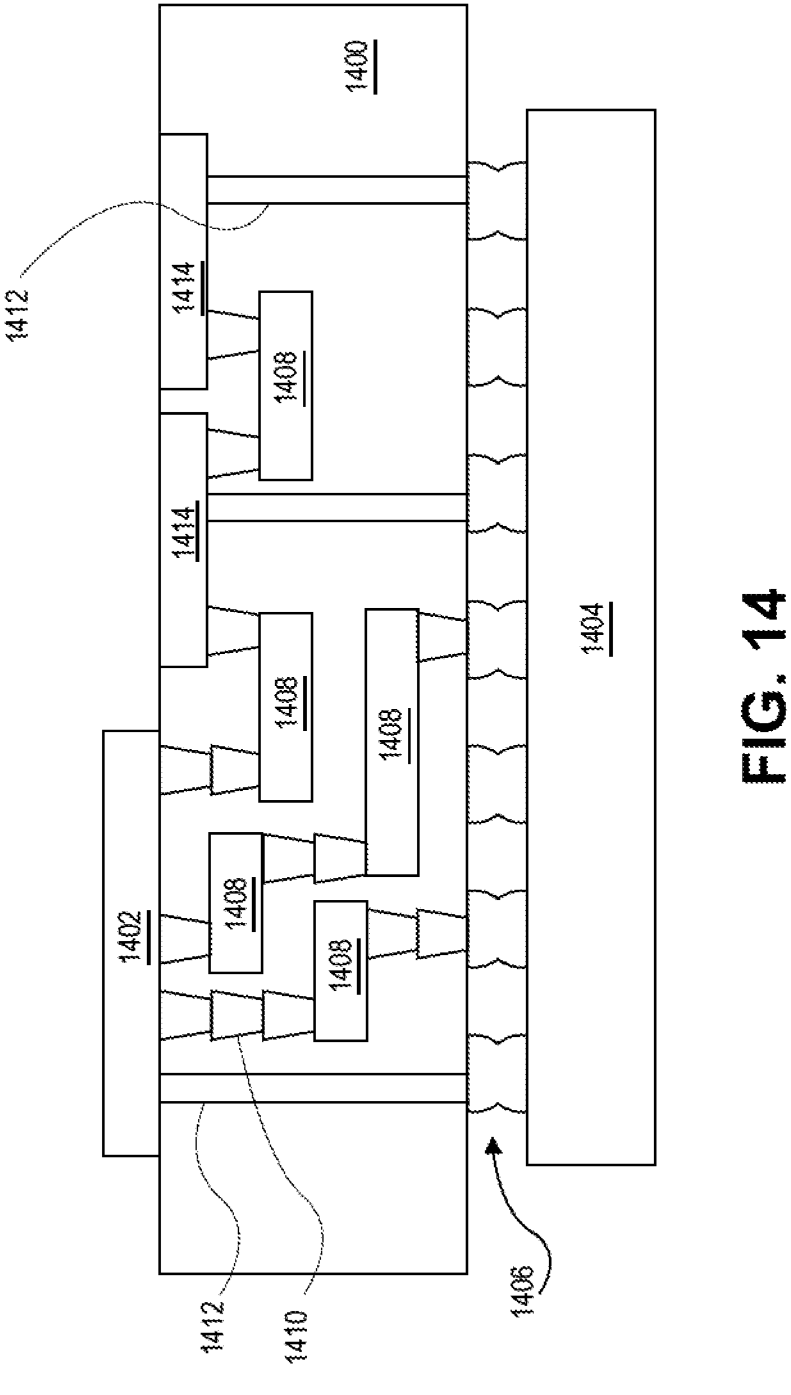
FIG. 14 illustrates an interposer that includes one or more embodiments of the disclosure.

FIG. 14 illustrates an interposer 1400 that includes one or more embodiments of the disclosure. The interposer 1400 is an intervening substrate used to bridge a first substrate 1402 to a second substrate 1404. The first substrate 1402 may be, for instance, an integrated circuit die. The second substrate 1404 may be, for instance, a memory module, a computer motherboard, or another integrated circuit die. Generally, the purpose of an interposer 1400 is to spread a connection to a wider pitch or to reroute a connection to a different connection. For example, an interposer 1400 may couple an integrated circuit die to a ball grid array (BGA) 1406 that can subsequently be coupled to the second substrate 1404. In some embodiments, the first and second substrates 1402/1404 are attached to opposing sides of the interposer 1400. In other embodiments, the first and second substrates 1402/1404 are attached to the same side of the interposer 1400. And in further embodiments, three or more substrates are interconnected by way of the interposer 1400.

The interposer 1400 may be formed of an epoxy resin, a fiberglass-reinforced epoxy resin, a ceramic material, or a polymer material such as polyimide. In further implementations, the interposer 1400 may be formed of alternate rigid or flexible materials that may include the same materials described above for use in a semiconductor substrate, such as silicon, germanium, and other group III-V and group IV materials.

The interposer 1400 may include metal interconnects 1408 and vias 1410, including but not limited to through-silicon vias (TSVs) 1412. The interposer 1400 may further include embedded devices 1414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1400. In accordance with embodiments of the disclosure, apparatuses or processes disclosed herein may be used in the fabrication of interposer 1400 or in the fabrication of components included in the interposer 1400.

Figure 15:
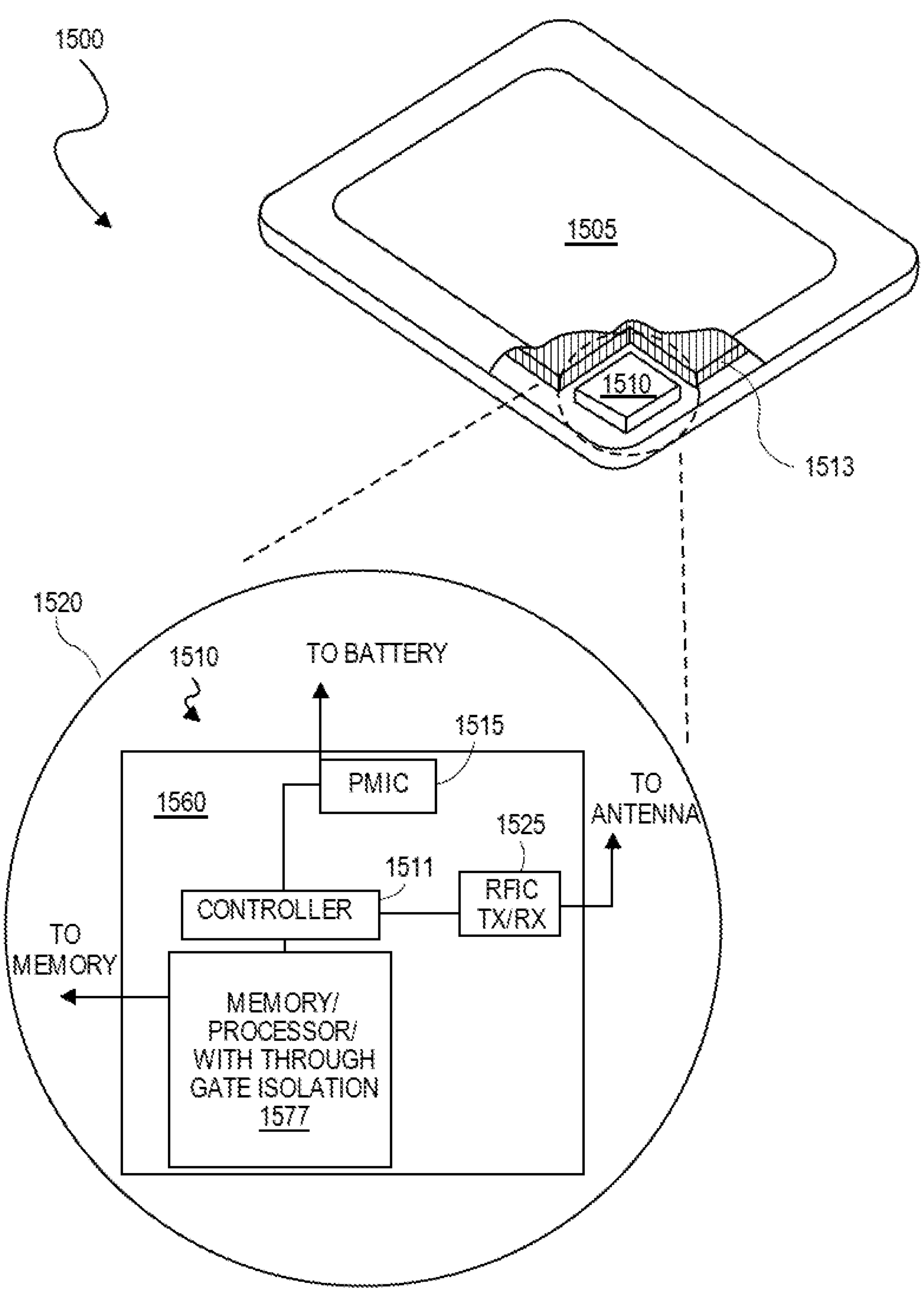
FIG. 15 is an isometric view of a mobile computing platform employing an IC fabricated according to one or more processes described herein or including one or more features described herein, in accordance with an embodiment of the present disclosure.

FIG. 15 is an isometric view of a mobile computing platform 1500 employing an integrated circuit (IC) fabricated according to one or more processes described herein or including one or more features described herein, in accordance with an embodiment of the present disclosure.

The mobile computing platform 1500 may be any portable device configured for each of electronic data display, electronic data processing, and wireless electronic data transmission. For example, mobile computing platform 1500 may be any of a tablet, a smart phone, laptop computer, etc. and includes a display screen 1505 which in the exemplary embodiment is a touchscreen (capacitive, inductive, resistive, etc.), a chip-level (SoC) or package-level integrated system 1510, and a battery 1513. As illustrated, the greater the level of integration in the system 1510 enabled by higher transistor packing density, the greater the portion of the mobile computing platform 1500 that may be occupied by the battery 1513 or non-volatile storage, such as a solid state drive, or the greater the transistor gate count for improved platform functionality. Similarly, the greater the carrier mobility of each transistor in the system 1510, the greater the functionality. As such, techniques described herein may enable performance and form factor improvements in the mobile computing platform 1500.

The integrated system 1510 is further illustrated in the expanded view 1520. In the exemplary embodiment, packaged device 1577 includes at least one memory chip (e.g., RAM), or at least one processor chip (e.g., a multi-core microprocessor and/or graphics processor) fabricated according to one or more processes described herein or including one or more features described herein. The packaged device 1577 is further coupled to the board 1560 along with one or more of a power management integrated circuit (PMIC) 1515, RF (wireless) integrated circuit (RFIC) 1525 including a wideband RF (wireless) transmitter and/or receiver (e.g., including a digital baseband and an analog front end module further includes a power amplifier on a transmit path and a low noise amplifier on a receive path), and a controller thereof 1511. Functionally, the PMIC 1515 performs battery power regulation, DC-to-DC conversion, etc., and so has an input coupled to the battery 1513 and with an output providing a current supply to all the other functional modules. As further illustrated, in the exemplary embodiment, the RFIC 1525 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1577 or within a single IC (SoC) coupled to the package substrate of the packaged device 1577.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 16:
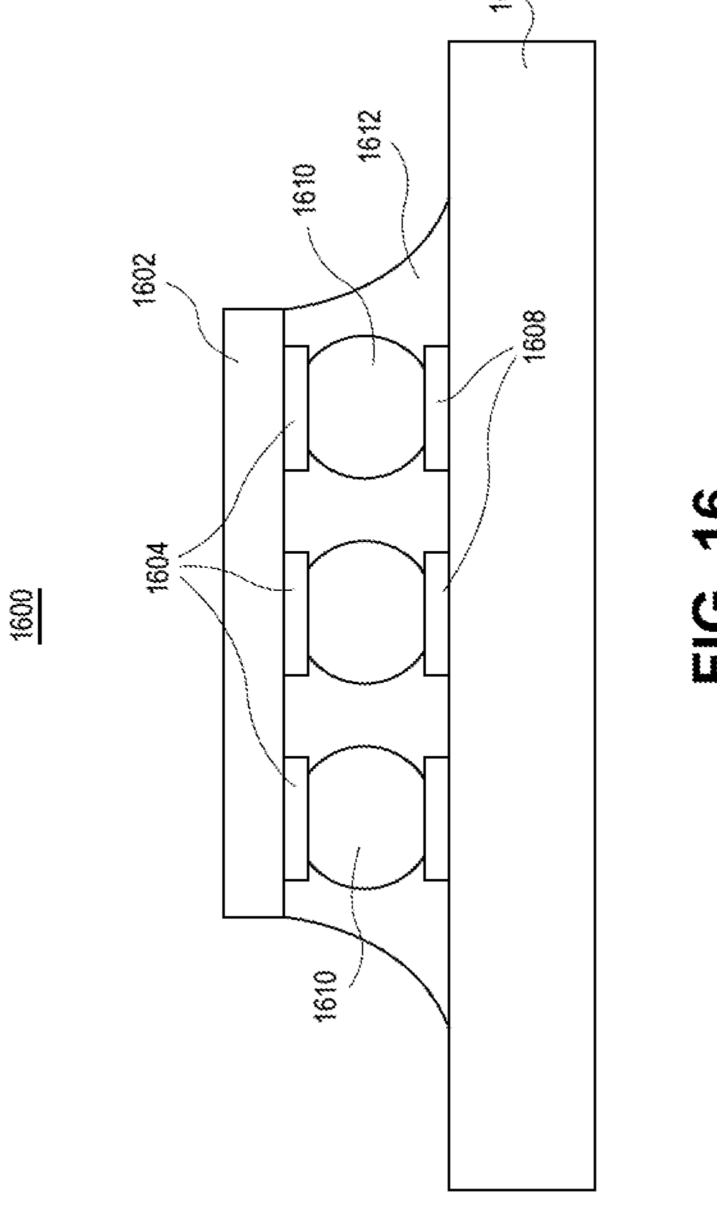
FIG. 16 illustrates a cross-sectional view of a flip-chip mounted die, in accordance with an embodiment of the present disclosure.

FIG. 16 illustrates a cross-sectional view of a flip-chip mounted die, in accordance with an embodiment of the present disclosure.

Referring to FIG. 16, an apparatus 1600 includes a die 1602 such as an integrated circuit (IC) fabricated according to one or more processes described herein or including one or more features described herein, in accordance with an embodiment of the present disclosure. The die 1602 includes metallized pads 1604 thereon. A package substrate 1606, such as a ceramic or organic substrate, includes connections 1608 thereon. The die 1602 and package substrate 1606 are electrically connected by solder balls 1610 coupled to the metallized pads 1604 and the connections 1608. An underfill material 1612 surrounds the solder balls 1610.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include integrated circuit structures having recessed trench contacts and deep boundary vias.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a plurality of gate lines extending over a plurality of semiconductor nanowire stack channel structures. A plurality of trench contacts extends over a plurality of source or drain structures, where a first one of the plurality of trench contacts has a recess therein. A backside metal routing layer is extending beneath the plurality of gate lines and beneath the plurality of trench contacts. A conductive structure couples the backside metal routing layer to a second one of the one or more of the plurality of trench contacts. The conductive structure includes a pillar portion in contact with the second one of the plurality of trench contacts, the pillar portion on a line portion, the line portion in contact with and extending along the backside metal routing layer.

Example embodiment 2: The integrated circuit structure of example embodiment 1, wherein the backside metal routing layer is a backside power delivery line.

Example embodiment 3: The integrated circuit structure of example embodiment 1 or 2, wherein the conductive structure is a recessed deep boundary via structure.

Example embodiment 4: The integrated circuit structure of example embodiment 1, 2 or 3, wherein the pillar portion of the conductive structure extends between a pair of N-type source or drain structures of plurality of source or drain structures or extends between a pair of P-type source or drain structures of plurality of source or drain structures.

Example embodiment 5: The integrated circuit structure of example embodiment 1, 2, 3 or 4, further including a dielectric liner along sides of the pillar portion and the line portion of the conductive structure.

Example embodiment 6: An integrated circuit structure includes a plurality of gate lines extending over a plurality of semiconductor fin structures. A plurality of trench contacts extends over a plurality of source or drain structures, where a first one of the plurality of trench contacts has a recess therein. A backside metal routing layer is extending beneath the plurality of gate lines and beneath the plurality of trench contacts. A conductive structure couples the backside metal routing layer to a second one of the plurality of trench contacts. The conductive structure includes a pillar portion in contact with the second one of the plurality of trench contacts, the pillar portion on a line portion, the line portion in contact with and extending along the backside metal routing layer.

Example embodiment 7: The integrated circuit structure of example embodiment 6, wherein the backside metal routing layer is a backside power delivery line.

Example embodiment 8: The integrated circuit structure of example embodiment 6 or 7, wherein the conductive structure is a recessed deep boundary via structure.

Example embodiment 9: The integrated circuit structure of example embodiment 6, 7 or 8, wherein the pillar portion of the conductive structure extends between a pair of N-type source or drain structures of plurality of source or drain structures or extends between a pair of P-type source or drain structures of plurality of source or drain structures.

Example embodiment 10: The integrated circuit structure of example embodiment 6, 7, 8 or 9, further including a dielectric liner along sides of the pillar portion and the line portion of the conductive structure.

Example embodiment 11: A computing device includes a board, and a component coupled to the board. The component includes an integrated circuit structure including a plurality of gate lines extending over a plurality of semiconductor nanowire stack channel structures. A plurality of trench contacts extends over a plurality of source or drain structures, where a first one of the plurality of trench contacts has a recess therein. A backside metal routing layer is extending beneath the plurality of gate lines and beneath the plurality of trench contacts. A conductive structure couples the backside metal routing layer to a second one of the one or more of the plurality of trench contacts. The conductive structure includes a pillar portion in contact with the second one of the plurality of trench contacts, the pillar portion on a line portion, the line portion in contact with and extending along the backside metal routing layer.

Example embodiment 12: The computing device of example embodiment 11, further including a memory coupled to the board.

Example embodiment 13: The computing device of example embodiment 11 or 12, further including a communication chip coupled to the board.

Example embodiment 14: The computing device of example embodiment 11, 12 or 13, further including a camera coupled to the board.

Example embodiment 15: The computing device of example embodiment 11, 12, 13 or 14, wherein the component is a packaged integrated circuit die.

Example embodiment 16: A computing device includes a board, and a component coupled to the board. The component includes an integrated circuit structure including a plurality of gate lines extending over a plurality of semiconductor fin structures. A plurality of trench contacts extends over a plurality of source or drain structures, where a first one of the plurality of trench contacts has a recess therein. A backside metal routing layer is extending beneath the plurality of gate lines and beneath the plurality of trench contacts. A conductive structure couples the backside metal routing layer to a second one of the plurality of trench contacts. The conductive structure includes a pillar portion in contact with the second one of the plurality of trench contacts, the pillar portion on a line portion, the line portion in contact with and extending along the backside metal routing layer.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, wherein the component is a packaged integrated circuit die.

What is claimed is:

1. An integrated circuit structure, comprising:

a plurality of gate lines extending over a plurality of semiconductor nanowire stack channel structures;

a plurality of trench contacts extending over a plurality of source or drain structures, wherein a first one of the plurality of trench contacts has a recess in metal of the trench contact;

a backside metal routing layer extending beneath the plurality of gate lines and beneath the plurality of trench contacts; and a conductive structure coupling the backside metal routing layer to a second one of the plurality of trench contacts, the conductive structure comprising a pillar portion in contact with the second one of the plurality of trench contacts, the pillar portion on a line portion, the line portion in contact with and extending along the backside metal routing layer.

2. The integrated circuit structure of claim 1, wherein the backside metal routing layer is a backside power delivery line.

3. The integrated circuit structure of claim 1, wherein the conductive structure is a recessed deep boundary via structure.

4. The integrated circuit structure of claim 1, wherein the pillar portion of the conductive structure extends between a pair of N-type source or drain structures of plurality of source or drain structures or extends between a pair of P-type source or drain structures of plurality of source or drain structures.

5. The integrated circuit structure of claim 1, further comprising a dielectric liner along sides of the pillar portion and the line portion of the conductive structure.

6. An integrated circuit structure, comprising:

a plurality of gate lines extending over a plurality of semiconductor fin structures;

a plurality of trench contacts extending over a plurality of source or drain structures, wherein a first one of the plurality of trench contacts has a recess in metal of the trench contact;

a backside metal routing layer extending beneath the plurality of gate lines and beneath the plurality of trench contacts; and a conductive structure coupling the backside metal routing layer to a second one of the plurality of trench contacts, the conductive structure comprising a pillar portion in contact with the second one of the plurality of trench contacts, the pillar portion on a line portion, the line portion in contact with and extending along the backside metal routing layer.

7. The integrated circuit structure of claim 6, wherein the backside metal routing layer is a backside power delivery line.

8. The integrated circuit structure of claim 6, wherein the conductive structure is a recessed deep boundary via structure.

9. The integrated circuit structure of claim 6, wherein the pillar portion of the conductive structure extends between a pair of N-type source or drain structures of plurality of source or drain structures or extends between a pair of P-type source or drain structures of plurality of source or drain structures.

10. The integrated circuit structure of claim 6, further comprising a dielectric liner along sides of the pillar portion and the line portion of the conductive structure.

11. A computing device, comprising:

a board; and a component coupled to the board, the component including an integrated circuit structure, comprising:

a plurality of gate lines extending over a plurality of semiconductor nanowire stack channel structures;

a plurality of trench contacts extending over a plurality of source or drain structures, wherein a first one of the plurality of trench contacts has a recess in metal of the trench contact;

a backside metal routing layer extending beneath the plurality of gate lines and beneath the plurality of trench contacts; and a conductive structure coupling the backside metal routing layer to a second one of the plurality of trench contacts, the conductive structure comprising a pillar portion in contact with the second one of the plurality of trench contacts, the pillar portion on a line portion, the line portion in contact with and extending along the backside metal routing layer.

12. The computing device of claim 11, further comprising:

a memory coupled to the board.

13. The computing device of claim 11, further comprising:

a communication chip coupled to the board.

14. The computing device of claim 11, further comprising:

a camera coupled to the board.

15. The computing device of claim 11, wherein the component is a packaged integrated circuit die.

16. A computing device, comprising:

a board; and a component coupled to the board, the component including an integrated circuit structure, comprising:

a plurality of gate lines extending over a plurality of semiconductor fin structures;

a plurality of trench contacts extending over a plurality of source or drain structures, wherein a first one of the plurality of trench contacts has a recess in metal of the trench contact;

a backside metal routing layer extending beneath the plurality of gate lines and beneath the plurality of trench contacts; and a conductive structure coupling the backside metal routing layer to a second one of the plurality of trench contacts, the conductive structure comprising a pillar portion in contact with the second one of the plurality of trench contacts, the pillar portion on a line portion, the line portion in contact with and extending along the backside metal routing layer.

17. The computing device of claim 16, further comprising:

a memory coupled to the board.

18. The computing device of claim 16, further comprising:

a communication chip coupled to the board.

19. The computing device of claim 16, further comprising:

a camera coupled to the board.

20. The computing device of claim 16, wherein the component is a packaged integrated circuit die.

* * * * *